(12) United States Patent  (10) Patent No.: US 7,680,235 B2
Sano et al.  (45) Date of Patent: Mar. 16, 2010

(54) VCO CIRCUIT, PLL CIRCUIT USING VCO CIRCUIT, AND DATA RECORDING APPARATUS THE PLL CIRCUIT

(75) Inventors: Masaki Sano, Kanagawa (JP); Kinji Kayanuma, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 1471 days.

(21) Appl. No.: 11/020,133

(22) Filed: Dec. 27, 2004

(65) Prior Publication Data

US 2005/0141662 A1 Jun. 30, 2005

(30) Foreign Application Priority Data

Dec. 25, 2003 (JP) .............................. 2003-429529

(51) Int. Cl.
    *H03D 3/24* (2006.01)
(52) U.S. Cl. ...................................................... 375/376
(58) Field of Classification Search .................. 375/376
    See application file for complete search history.

(56) References Cited

U.S. PATENT DOCUMENTS 5,452,326 A * 9/1995 Tanaka ........................ 375/376

2002/0043995 A1 * 4/2002 Wang et al. ................. 327/156

FOREIGN PATENT DOCUMENTS

JP 2002-100965 4/2002
JP 2003-209468 7/2003

* cited by examiner

*Primary Examiner*—David C Payne
*Assistant Examiner*—Tanmay K Shah
(74) *Attorney, Agent, or Firm*—Young & Thompson

(57) ABSTRACT

A PLL circuit includes a phase comparing section, a low pass filter, a digital VCO circuit, and a frequency divider. The phase comparing section compares an inputted clock signal and a frequency-divided clock signal in phase to detect a phase difference. The low pass filter averages the phase difference outputted from the phase comparing section to output the averaged result as a frequency control input. The digital VCO circuit operates in synchronism with a reference clock signal, and generates a sync clock signal based on the frequency control input while a phase of the sync clock signal is controlled in units of predetermined resolution values. The predetermined resolution value is a 1/K (K is a natural number more than 1) of a period of the reference clock signal. The frequency divider frequency-divides the synch clock signal to generate the frequency-divided clock signal.

5 Claims, 18 Drawing Sheets

VCO CIRCUIT, PLL CIRCUIT USING VCO CIRCUIT, AND DATA RECORDING APPARATUS THE PLL CIRCUIT

BACKGROUND OF THE INVENTION

1. Field of the Invention

The present invention relates to a VCO circuit using a digital VCO, a PLL circuit using the VCO circuit, a data recording apparatus using the PLL circuit.

2. Description of the Related Art

A conventional data recording apparatus carries out recording and reproducing processes of data to recording media such as optical discs, e.g., CD-R and DVD-R/RW. Such a conventional data recording apparatus acquires a rotation synchronous signal from the recording medium and extracts a synchronous clock signal based on the rotation synchronous signal to use the synchronous clock signal as a record clock signal in the recording and reproducing processes.

Generally, a PLL (phase Locked loop) circuit is used for the extraction of such a periodical clock signal. Moreover, the PLL circuit can be used for various purposes in addition to the purpose of reproduction and extraction of the synchronous clock signal. The PLL circuit includes a VCO (Voltage Controlled Oscillator). The VCO converts the level of an input signal into an oscillation frequency, i.e., outputs an oscillation signal with a frequency corresponding to the input signal level. The PLL circuit outputs the synchronous clock signal with the input signal by controlling the phase of the signal outputted from the VCO.

An analog VCO has a large manufacturing process dependent deviation in input-output characteristics and a high temperature dependence. Therefore, the output of the analog VCO is generally stabilized by using a PLL loop. For this reason, a digital VCO is used, when the PLL circuit characteristic influences the performance of the data recording apparatus using the PLL circuit, when a broadband oscillation signal should be necessary, or when the deviation in characteristic of the PLL circuit should be suppressed in an LSI. The digital VCO has various advantages such as the linearity of an input/output signal in a wide range, small deviation in input-output characteristics, and easy manufacturing of the LSI.

In the digital VCO, it is supposed that the frequency of the output oscillation signal from the digital VCO is F and the frequency of a reference clock signal is Fref. In this case, a frequency control input is phase difference data expressed by bits in case of the PLL circuit (containing a case of a signal filtered by a filter) and is supplied to the digital VCO as digital data. The output of the digital VCO is a pulse signal or a clock signal with an oscillation frequency corresponding to the frequency control input.

An output period resolution or output frequency resolution of the digital VCO is determined in accordance with the frequency Fref of the reference clock signal used to drive the digital VCO. For example, when the frequency F of the oscillation signal to be generated is coincident with Fref/N (N is a natural number), it is possible for the digital VCO to oscillate correctly at a desired frequency. However, when the digital VCO should oscillate at a desired frequency between Fref/N and Fref/(N+1), it is not possible for the digital VCO to oscillate correctly at the desired frequency. In such a case, it is necessary to output a clock signal with the period of N/Fref and a clock signal with the period of N+1/Fref at a predetermined rate. By outputting such clock signals with the different periods at the predetermined rate, the clock signal with the desired frequency can be outputted.

However, a phase shift or a phase error exists between the desired clock signal and the actually outputted clock signal at each clock timing. This produces a spurious band. This spurious band causes jitter. Therefore, it is desirable to restrain the generation of the spurious band as much as possible, namely, to output the clock signal with the desired output timings. For this purpose, it is necessary to improve the phase resolution of the VCO in the PLL circuit.

In the conventional digital PLL circuit, the frequency of the reference clock signal must be made high for the improvement of the resolution. However, there is a limit in the operation frequency of an adder of the digital VCO. When the frequency of the reference clock signal is made high, the reference clock signal is easy to undergo influence of noise and the waveform of the reference clock signal is distorted not to keep the pulse shape. As a result, the operation of a logic circuit becomes instable. Also, because the adder outputs a calculation result at the timing synchronized with the reference clock signal, the phase precision is not always improved.

Also, in the data recording apparatus which carries out a data recording process in response to a record clock signal generated by the PLL circuit using the VCO, it is not possible to sufficiently reduce clock jitter at a high-speed operation. As a result, it is difficult to accomplish high record quality.

A VCO circuit, a PLL circuit and a data recording apparatus are disclosed in Japanese Laid Open Patent Application (JP-P2003-209468A). In this conventional example, a phase error data with a resolution finer than the period of an output clock signal is outputted at a same timing as that of the output oscillation signal. Phase modulation is carried out at an edge timing of the output oscillation signal of the digital VCO based on the phase error data so as to shift the spurious band to a band apart from the frequency band of the output oscillation signal. Thereafter, the sifted spurious band is cut using a band pass filter (BPF). Thus, a clock signal with few jitters is outputted.

However, the above conventional example does not reduce the absolute value of intensity of a signal at the spurious band. That is, the generation of the spurious band itself is not suppressed. Therefore, there is a fear that jitter is generated due to the spurious band in the band apart from the fundamental frequency of the reference clock signal.

In this way, in the conventional technique, the VCO cannot control the output timing of a clock signal finer than the period of a reference clock signal. Also, the generation of a phase error itself or the generation of the spurious band cannot be reduced.

SUMMARY OF THE INVENTION

An object of the present invention is to provide a VCO circuit using a digital VCO, a PLL circuit using the VCO circuit, and a data recording apparatus, in which the output timing of a clock signal can be controlled finer than the period of a reference clock signal.

In an aspect of the present invention, a PLL circuit includes a phase comparing section, a low pass filter, a digital VCO circuit, and a frequency divider. The phase comparing section compares an inputted clock signal and a frequency-divided clock signal in phase to detect a phase difference. The low pass filter averages the phase difference outputted from the phase comparing section to output the averaged result as a frequency control input. The digital VCO circuit operates in synchronism with a reference clock signal, and generates a sync clock signal based on the frequency control input while a phase of the sync clock signal is controlled in units of predetermined resolution values. The predetermined resolution value is a 1/K (K is a natural number more than 1) of a period of the reference clock signal. The frequency divider frequency-divides the synch clock signal to generate the frequency-divided clock signal.

The digital VCO circuit may include a VCO and a delay line The VCO operates in synchronism with a reference clock signal and generates an actual VCO output clock signal and a delay quantity data based on the frequency control input and the reference clock signal. The delay quantity data represents a phase difference between the actual VCO output clock signal and a desired VCO output clock signal in units of the predetermined resolution values. The delay line delays the VCO output clock signal based on the delay quantity data to output the sync clock signal.

Also, the digital VCO circuit may include a VCO, a multi-phase signal generating circuit, and an average phase output circuit. The VCO operates in synchronism with a reference clock signal and generates an actual VCO output clock signal and a delay quantity data based on the frequency control input and the reference clock signal. The delay quantity data representing a phase difference between the actual VCO output clock signal and a desired VCO output clock signal in units of the predetermined resolution values. The multi-phase signal generating circuit generates a plurality of internal phase difference signals indicating the delay quantity data in response to the VCO output clock signal. The average phase output circuit averages phases indicated by the plurality of internal phase difference signals to output the sync clock signal.

In this case, the number of the plurality of internal phase difference signals may be equal to a number of digits of binary data indicating resolution of the delay quantity data, or may be equal to resolution of the delay quantity data.

Also, the average phase output circuit may include a plurality of phase comparators, a plurality of charge pumps, an adder, a loop filter and a VCO. Each of the plurality of phase comparators compares a phase of the sync clock signal and the phase indicated by a corresponding one of the plurality of internal phase difference signals. Each of the plurality of charge pumps outputs an amplitude signal with a predetermined amplitude based on a comparing result by a corresponding one of the plurality of phase comparators. The adder adds the plurality of amplitude signals outputted from the plurality of charge pumps while amplifying the amplitudes of the plurality of amplitude signals to magnitudes allocated to the plurality of phase comparators to produce an addition resultant signal. The loop filter passes only a DC component of the addition resultant signal. The VCO outputs the sync clock signal corresponding to the DC component.

Also, the average phase output circuit may include a plurality of phase comparators, a plurality of charge pumps, an adder, a loop filter and a VCO. Each of the plurality of phase comparators compares a phase of the sync clock signal and the phase indicated by a corresponding one of the plurality of internal phase difference signals. Each of the plurality of charge pumps outputs an amplitude signal with a predetermined amplitude based on a comparing result by a corresponding one of the plurality of phase comparators. The adder adds the plurality of amplitude signals outputted from the plurality of charge pumps to produce an addition resultant signal. The loop filter passes only a DC component of the addition resultant signal. The VCO outputs the sync clock signal corresponding to the DC component.

Also, the average phase output circuit may include a plurality of phase comparators, a plurality of charge pumps, an adder, a loop filter and a VCO. Each of the plurality of phase comparators compares a phase of the sync clock signal and the phase indicated by a corresponding one of the plurality of internal phase difference signals. Each of the plurality of charge pumps outputs an amplitude signal with an amplitude corresponding to a comparing result by a corresponding one of the plurality of phase comparators. The adder adds the plurality of amplitude signals outputted from the plurality of charge pumps to produce an addition resultant signal. The loop filter passes only a DC component of the addition resultant signal. The VCO outputs the sync clock signal corresponding to the DC component.

Also, the digital VCO circuit may include a VCO, a phase modulating section, a delay line and a frequency band limiting section. The VCO operates in synchronism with a reference clock signal and generates an actual first output clock signal and a first delay quantity data based on the frequency control input and the reference clock signal. The first delay quantity data representing a phase difference between the actual first output clock signal and a desired first output clock signal in units of the predetermined resolution values. The phase modulating section carries out phase modulation to the first output clock signal based on the first delay quantity data to generate a second output clock signal and a second delay quantity data. The delay line configured to delay the second output clock signal based on the second delay quantity data to generate a third output clock signal. The frequency band limiting section configured to limit a band of the third output clock signal to output the sync clock signal.

In this case, the phase modulating section may include a pulse generator, a delay unit, a selector and a trigger counter. The pulse generator generates the second delay quantity data in response to the first delay quantity data. The delay unit delays the first output clock signal to generate a first delayed output clock signal. The selector selects one of the first output clock signal and the first delayed output clock signal based on the second delay quantity data. The trigger counter converts a selected clock signal from the selector to have a duty of 50%.

In another aspect of the present invention, a data recording/reproducing apparatus includes a spindle section, a spindle rotation control section, an optical head and a PLL circuit. The spindle section rotates an optical disc. The spindle rotation control section controls the spindle section in response to a sync clock signal. The optical head configured to read out data recorded on the optical disc to generate a detection clock signal. The PLL circuit includes a phase comparing section, a low pass filter, a digital VCO circuit, and a frequency divider. The phase comparing section compares an inputted clock signal and a frequency-divided clock signal in phase to detect a phase difference. The low pass filter averages the phase difference outputted from the phase comparing section to output the averaged result as a frequency control input. The digital VCO circuit operates in synchronism with a reference clock signal, and generates a sync clock signal based on the frequency control input while a phase of the sync clock signal is controlled in units of predetermined resolution values. The predetermined resolution value is a 1/K (K is a natural number more than 1) of a period of the reference clock signal. The frequency divider frequency-divides the synch clock signal to generate the frequency-divided clock signal.

In another aspect of the present invention, a digital VCO circuit includes a digital VCO and a delay section. The digital VCO operates in synchronism with a reference clock signal, and generates an actual VCO output clock signal and a delay quantity data based on a frequency control input and the reference clock signal. The delay quantity data represents a phase difference between the actual VCO output clock signal and a desired VCO output clock signal in units of predetermined resolution values. The predetermined resolution value is a 1/K (K is a natural number more than 1) of a period of the reference clock signal. The delay section delays the VCO output clock signal based on the delay quantity data to generate an output clock signal.

In another aspect of the present invention, a digital VCO circuit includes an adder, a modulo calculating section, a delay quantity calculating section and a clock generating section. The adder adds a phase corresponding to a frequency control input and an internal phase delay data in response to each of clocks of a reference clock signal. The modulo calculating section calculates a surplus by dividing an addition result by the adder by a resolution and to output the surplus as the internal phase delay data for a next clock of the reference clock signal. The clock generating section generates an actual VCO output clock signal based on the next internal phase data and the period of the desired VCO output clock signal. The delay quantity calculating section calculates a phase difference between said desired VCO output clock signal and said actual VCO output clock signal, and generates a delay quantity data based on the phase difference and a predetermined resolution value which is a 1/K (K is a natural number more than 1) of a period of the reference clock signal.

DESCRIPTION OF THE PREFERRED EMBODIMENTS

Hereinafter, a digital VCO circuit, a PLL circuit using the VCO circuit of the present invention and a data recording apparatus to which the PLL circuit is applied will be described in detail with reference to the attached drawings.

First Embodiment

Figure 1:
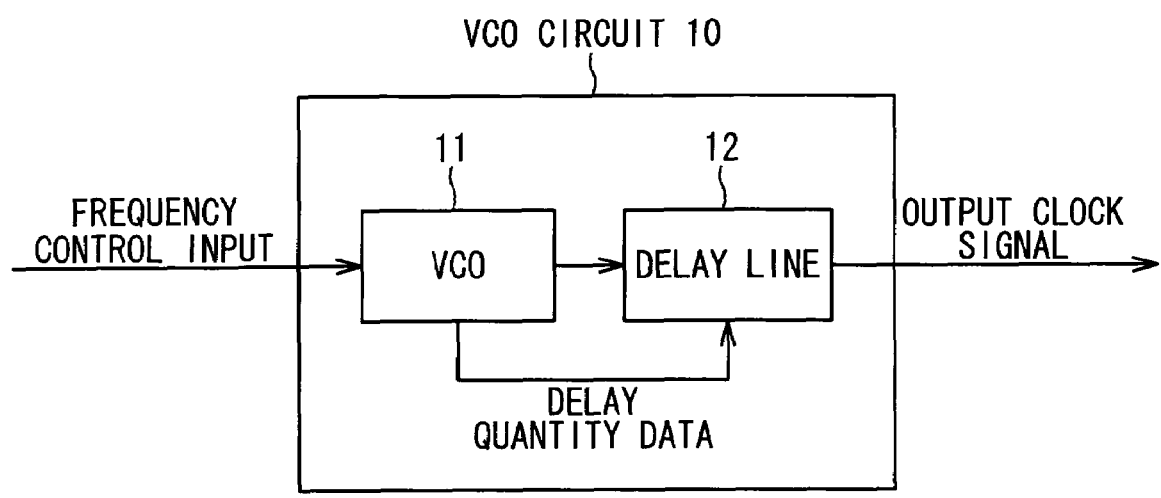
FIG. 1 is a block diagram showing the circuit configuration of a VCO circuit according to a first embodiment of the present invention.

FIG. 1 is a block diagram showing the circuit configuration of the VCO circuit according to the first embodiment of the present invention. The VCO circuit 10 includes a VCO 11 and a delay line 12. The VCO circuit 10 operates in response to a reference clock signal. The VCO 11 receives a frequency control input and outputs a VCO output clock signal and delay quantity data. The delay line 12 delays the VCO output clock signal based on the delay quantity data to generate an output clock signal.

Figure 2:
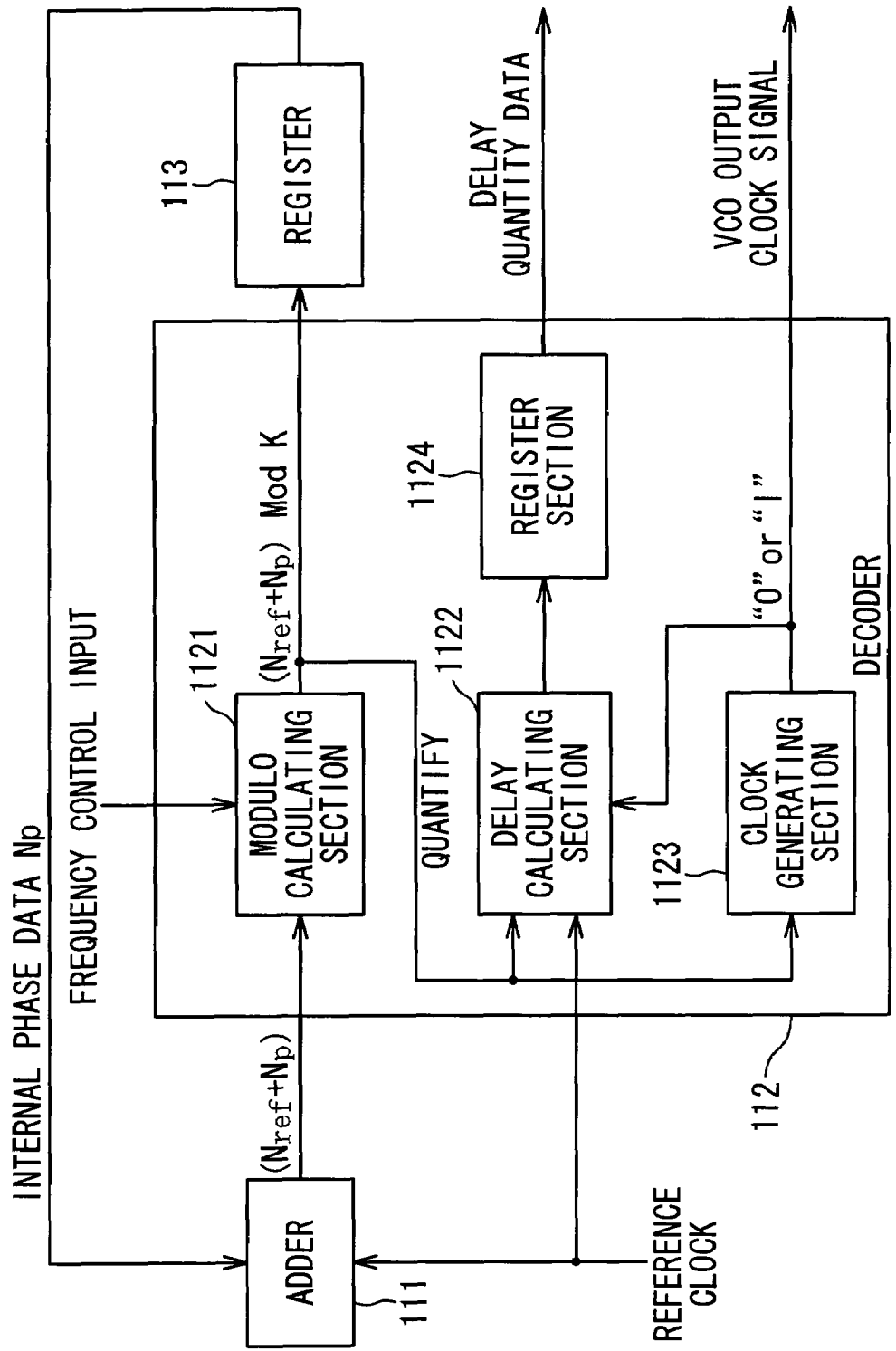
FIG. 2 is a block diagram showing the circuit configuration of a VCO used in the VCO circuit in the first embodiment.

FIG. 2 shows the circuit configuration of the VCO 11. The VCO 11 includes an adder 111, a decoder 112 and a register 113. The adder 111 adds Nref corresponding to the period of the reference clock signal and internal frequency data Np supplied from the register 113 and outputs an addition result (Nref+Np) to the decoder 112. In this case, if an initial value of the phase is instructed by the frequency control data, the initial value may be added to the addition result. The decoder 112 outputs new internal frequency data Np for a next period of the reference clock signal to the register 113 based on the frequency control input Mf and the addition result supplied from the adder 111. Also, the decoder 112 outputs the delay quantity data and the VCO output clock signal to the delay line 12. The register 113 latches and outputs the new internal frequency data Np supplied from the decoder 112 to the adder 111.

The decoder 112 includes a modulo calculating section 1121, a delay quantity calculating section 1122, a clock generating section 1123 and a register section 1124. The modulo calculating section 1121 divides the addition result (Nref+Np) supplied from the adder 111 by a value K corresponding to a desired period of the VCO output clock signal which is determined based on a period Mp obtained from the frequency control input Mf, and outputs a remainder [(Nref+Np) mod K] as new internal phase data Np to the delay quantity calculating section 1122, the clock generating section 1123 and the register 113. Here, [A mod B] indicates a remainder when A is divided by B. The clock generating section 1123 outputs the VCO output clock signal to the delay line 12 and the delay quantity calculating section 1122. Specifically, the clock generating section 1123 outputs as the VCO output clock signal, "1" when the new supplied from the modulo calculating section 1121 is smaller than K/2, and "0" when it is not smaller. The delay quantity calculating section 1122 calculates delay quantity data based on the remainder from the modulo calculating section 1121, the reference clock signal, and the output from the clock generating section 1123 and outputs the delay quantity data to the register section 1124. Specifically, the delay quantity calculating section 1122 calculates a phase difference between the timing when the VCO output clock signal becomes "1" and the timing when the internal phase data Np becomes a predetermined value Kr. In this case, Kr is smaller than the period of the reference clock signal. Then, the delay quantity calculating section 1122 divides the calculated phase difference by 1/16 of the period of the reference clock signal, and rounds up the dividing result and outputs as the delay quantity data. In this case, the value of "16" is predetermined based on a desired resolution. In place of "16", an optional natural number may be used. The register section 1124 latches and outputs the delay quantity data outputted from the delay quantity calculating section 1122 to the delay line 12.

The operation of the VCO circuit 10 according to this embodiment will be described. The adder 111, the decoder 112 and the register 113 operate in synchronous with the reference clock signal. Therefore, the data outputted from the adder 111, the decoder 112 and the register 113 are updated for every period of the reference clock signal as a unit time. When each section of the VCO circuit 10 carries out the above operation in each period of the reference clock signal, the internal phase data Np is increased by the period of the reference clock signal for every one period of the reference clock signal.

At this time, an oscillation frequency F of the VCO output clock signal outputted from the clock generating section 1123 is expressed as F=Fref*Mp/K. When K/Mp is an integer N, F is a clock signal with a constant period obtained by frequency-dividing the reference clock signal frequency Fref into 1/N (N=K/Mp). However, when K/Mp is not an integer, in other words, when K/Mp=N+α (0<α<1), the VCO output clock signal is obtained in which a clock signal with the period of N/Fref and a clock signal with the period of (N+1)/Fref are mixed.

Figure 3:
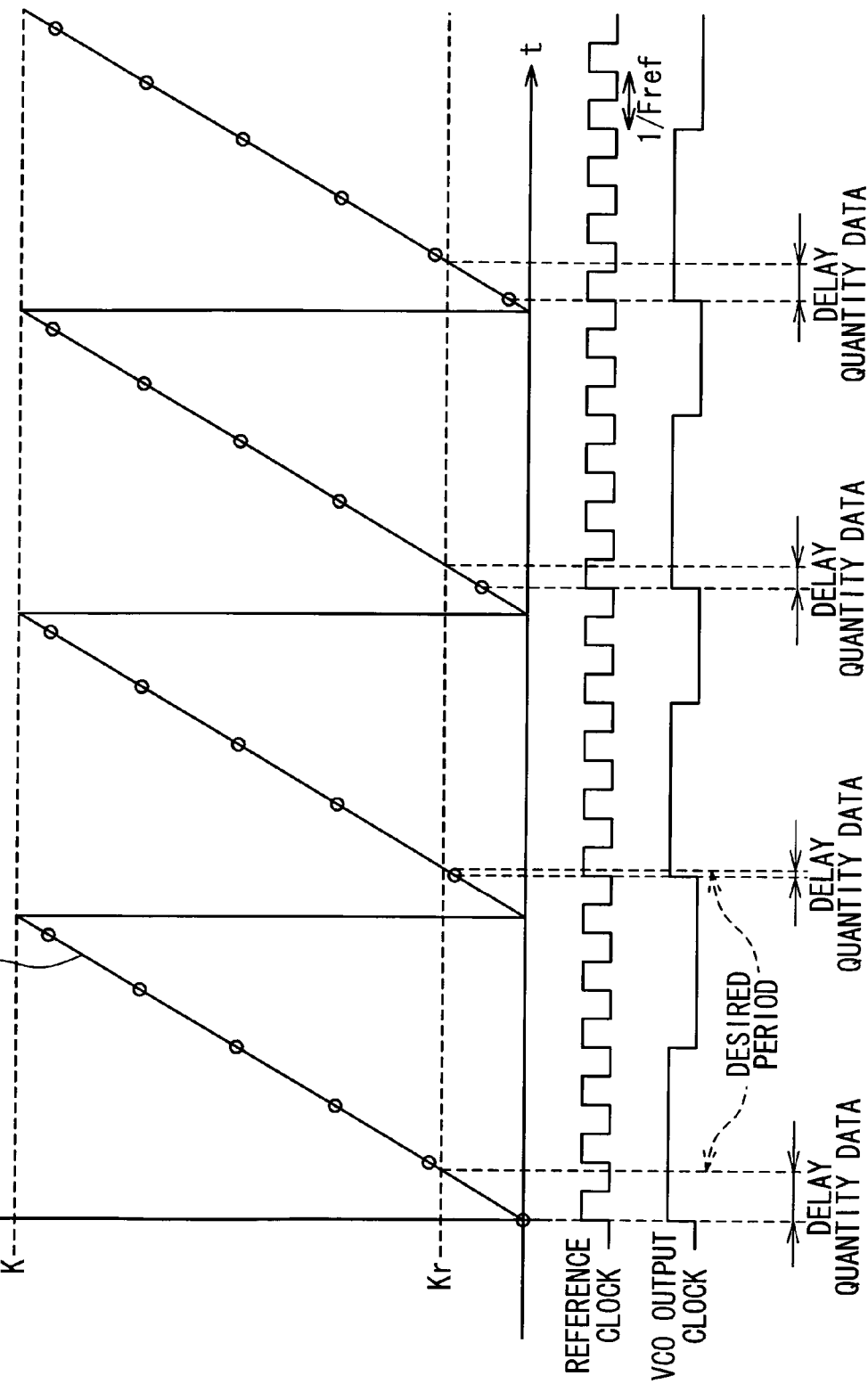
FIG. 3 is a diagram showing an operation of the VCO in the first embodiment.

As shown in FIG. 3, if the frequency control input Mf is constant or almost constant when Np is expressed on the vertical axis and time is expressed on the horizontal axis, the value of Np is plotted as a step waveform, although Np is shown in FIG. 3 as a line. A timing when the value of Np increases and exceeds a predetermined threshold Kr is defined as a desired phase. At this time, the difference between the timing when the internal phase data Np becomes the predetermined value Kr and the timing when the rising edge of the VCO output clock signal is outputted from the clock generating section 1123 to the delay quantity calculating section 1122 is a phase difference. The phase difference is calculated through interpolation or proportional distribution. The phase difference is divided by 1/16 of the period of the reference clock signal and the divided result is rounded up. Then, the rounded-up result is outputted as the delay quantity data. Thus, the delay quantity data can be defined based on which of time zones a timing when Np reaches Kr belongs to, if the reference clock signal period is equally separated into the time zones by an optional natural number equal to or more than 2 (in this example, 16). For example, it is supposed that the delay quantity calculating section 1122 equally divides the one period (1/Fref) of the reference clock signal by m to produces m time zones for calculating the delay quantity data. In this case, when the output timing of the conventional VCO output clock signal is T, and the timing of the ideal phase is t, the delay quantity data is "1" if T<t≦T+1/(m*Fref). Also, the delay quantity data is "2" if T+1/(m*Fref)<t≦T+2/(m*Fref). That is, generally, the delay quantity data is n if T+n/(m*Fref)<t≦T+(n+1)/(m*Fref) (here, n is a natural number equal to or smaller than m).

The delay quantity calculating section 1122 outputs the delay quantity data obtained as described above, to the register section 1124. The delay quantity data is outputted onto the delay line 12 after being temporarily held by the register section 1124.

It should be noted that the value m of the reference clock signal period may be a predetermined value and may be optionally changed. When the value m is optionally changed, the delay quantity calculating section 1122 outputs the delay quantity data containing the value m.

Figure 4:
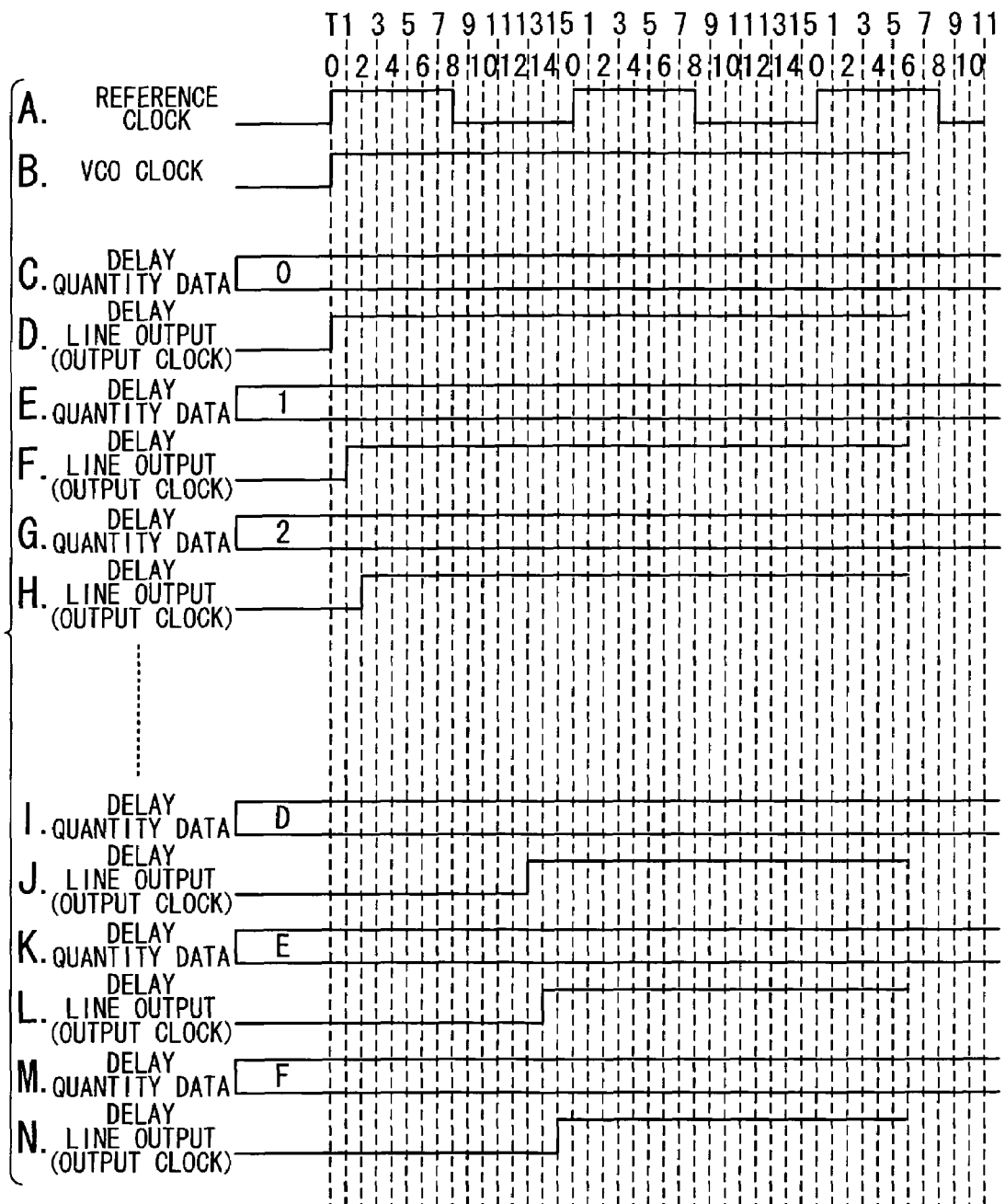
FIGS. 4A to 4N are timing charts showing an operation example of a delay line of the VCO circuit in the first embodiment.

As shown in FIGS. 4A to 4N, the delay line 12 outputs the VCO output clock signal delayed from a time T by a time determined in accordance with the delay quantity data supplied from the decoder 112. That is, when the delay quantity calculating section 1122 divides the one period of the reference clock signal by m equally and calculates the delay quantity data n. The delay quantity data n is supplied from the decoder 112 to the delay line 12, and the delay line 12 outputs the VCO output clock signal delayed from the time T by the time of n/m·Fref.

By carrying out the above process by the VCO circuit 10, an output clock signal outputted from the delay line 12 has the resolution of m times, compared with the VCO output clock signal outputted from the decoder 112.

Figure 5:
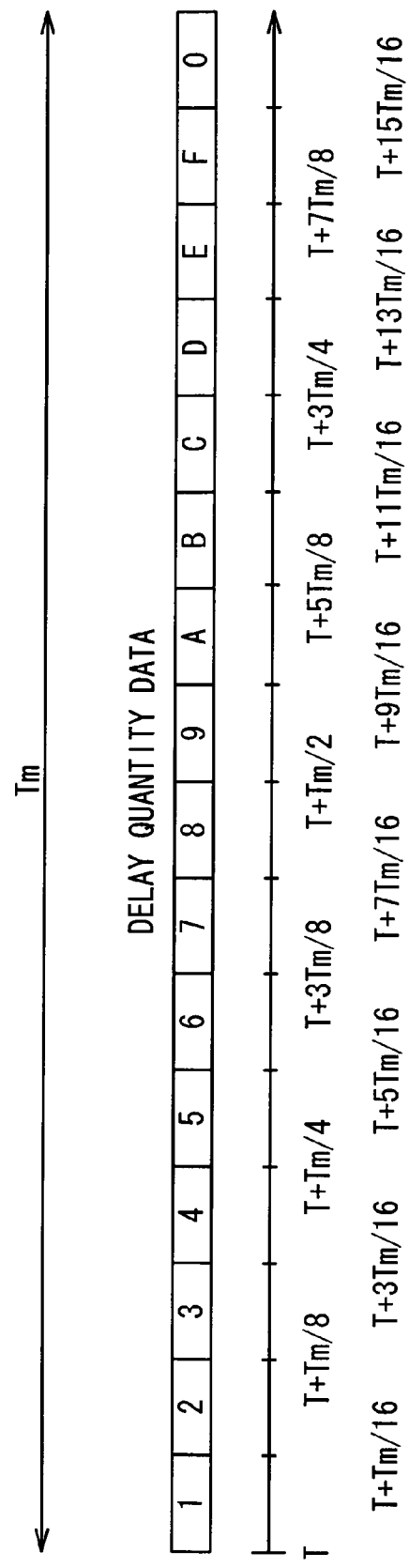
FIG. 5 is a diagram showing an example of a relation between output timing and delay quantity data of an output clock signal of the VCO circuit in the first embodiment.

The above-mentioned operation will be described using a specific example. As shown in FIG. 5, it is supposed that m=16. In this case, the delay quantity data is expressed as hexadecimal data indicating which of 16 time zones obtained by dividing the reference clock signal period by 16 the timing when Np reaches M−1 is contained in. If there is a timing t for the ideal phase in a first one of 16 time zones obtained by dividing the reference clock signal period Tm (=1/Fref) by 16 from the output timing T of the conventional VCO output clock signal, in other words, if T<t≦T+Tm/16, the delay quantity data is "1". Similarly, if there is the timing t for the ideal phase in a second one of 16 time zones obtained by dividing the reference clock signal period Tm (=1/Fref) by 16, from the output timing T of the conventional VCO output clock signal, in other words, if T+Tm/16<t≦T+2Tm/16, the delay quantity data is "2". That is, if there is the timing t for the ideal phase in a n-th one of 16 time zones obtained by dividing the reference clock signal period Tm (=1/Fref) by 16, from the output timing T of the conventional VCO output clock signal, the delay quantity data is a hexadecimal notation of n (n is a natural number equal to or less than 15). It should be noted that when m=n (m=16 in this example), the delay quantity data is "0".

The delay line 12 outputs the VCO output clock signal at the timing delayed from the output timing of the conventional VCO output clock signal by 1/16 of the reference clock signal period Tm, if the delay quantity data supplied from the delay quantity calculating section 1122 is "1". Similarly, the delay line 12 outputs the VCO output clock signal at the timing delayed from the output timing of the conventional VCO output clock signal by 1/8 of the reference clock signal period Tm, if the delay quantity data is "2". Thus, the clock signal outputted from the delay line 12 has the phase resolution of 16 times, compared with the VCO output clock signal outputted from the decoder 112.

It should be noted that the method of determining the delay quantity data as described above is only an example. The setting of the boundary condition and the value of the delay quantity data corresponding to each period are never limited to the above-mentioned example. For example, the delay quantity data may be "0" when the output timing of the VCO output clock signal exists in T≦t<T+Tm/16.

In this way, the delay quantity data (the difference between the ideal phase and the output clock signal phase) is outputted from the VCO circuit to have the resolution higher than the reference clock signal period. It is possible to improve the phase precision of the output clock signal by delaying the VCO output clock signal by the delay line 12 based on the delay quantity data.

Second Embodiment

Figure 6:
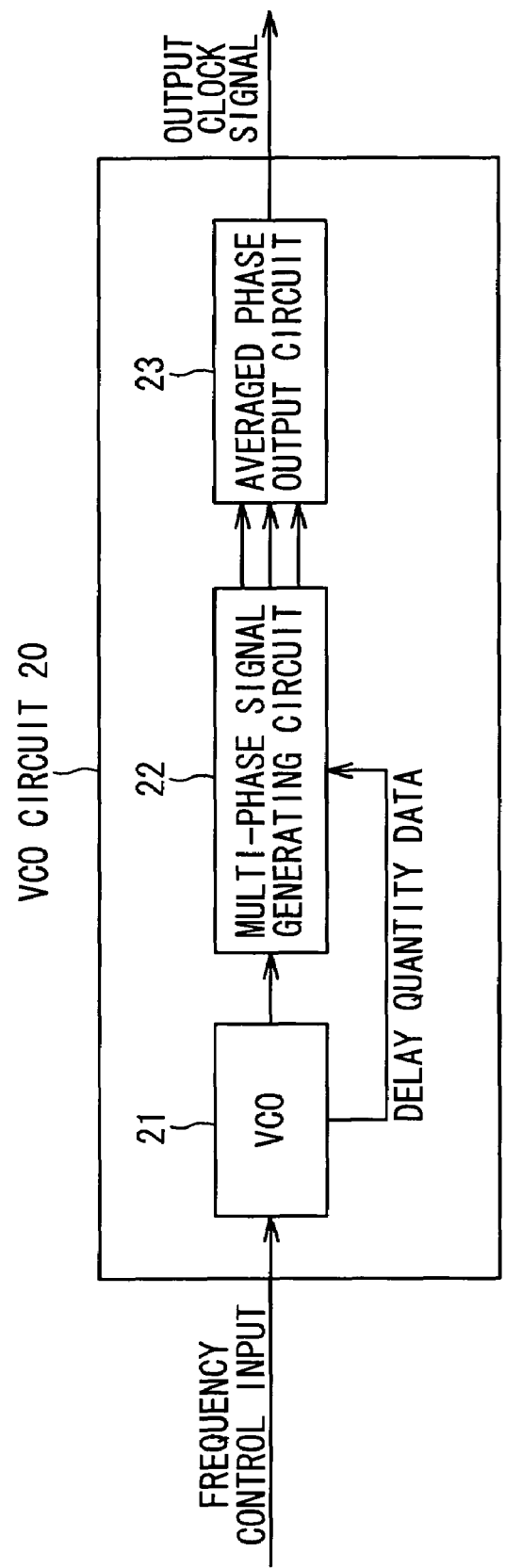
FIG. 6 is a block diagram showing the circuit configuration of the VCO circuit according to a second embodiment of the present invention.

The VCO circuit according to the second embodiment of the present invention will be described. FIG. 6 is a diagram showing the circuit configuration of the VCO circuit 20 according to the second embodiment. The VCO circuit 20 in the second embodiment has a VCO 21, a multi-phase signal generating circuit 22 and an averaged phase output circuit 23. The VCO 21 has the same circuit configuration as the VCO 11 of the VCO circuit 10 in the first embodiment. The multi-phase signal generating circuit 22 generates a plurality of clock signals as a multi-phase clock signal based on the delay quantity data in synchronous with the reference clock signal and the VCO output clock signal. The averaged phase output circuit 23 outputs an output clock signal with a phase obtained by averaging the phases of the plurality of clock signals.

Figure 7:
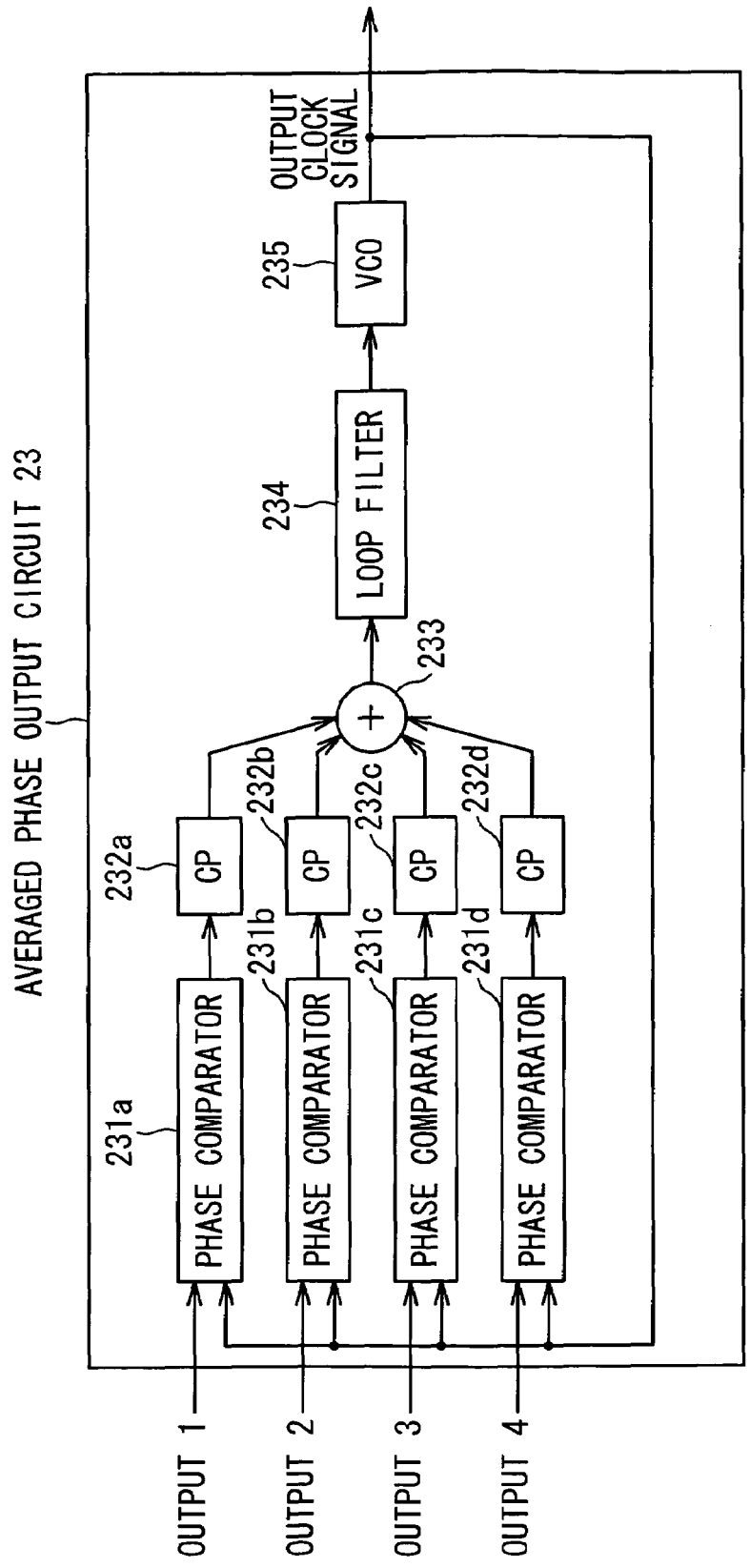
FIG. 7 is a block diagram showing the circuit configuration of an average phase output circuit of the VCO circuit in the second embodiment when the output of a multiphase signal generating circuit is of 4 bits.

FIG. 7 is a diagram showing the circuit configuration of the averaged phase output circuit 23 when the output of multi-phase signal generating circuit 22 represents 4 values by 2 bits. The averaged phase output circuit 23 includes phase comparators 231a to 231d, charge pumps (CP) 232a to 232d, an adder 233, a loop filter 234 and a VCO 235.

Each of the phase comparators 231a to 231d compares a corresponding one of the input values, i.e., 1 to 4, from the multi-phase signal generating circuit 22 and the phase of the output clock signal from the VCO 235 and outputs a phase difference between them to a corresponding one of the charge pumps 232a to 232d as a pulse-like phase difference signal. Each of the charge pumps 232a to 232d is a voltage converter to change only the signal amplitude (voltage) without changing the waveform of the signal outputted from the corresponding one of the phase comparators 231a to 231d. The adder 233 adds or synthesizes the output signals of the charge pumps 232a to 232d and outputs a synthetic signal to the loop filter 234. The loop filter 234 removes the high frequency component of the synthetic signal outputted from the adder 233 and produces and outputs a signal with a direct current component to the VCO 235 as a control signal. At this time, a spurious component is suppressed. The VCO 235 has a predetermined self-oscillation frequency and changes the oscillation frequency in accordance with the control signal supplied from the loop filter 234. It should be noted that the VCO 235 may be one in the conventional technique.

Figure 8:
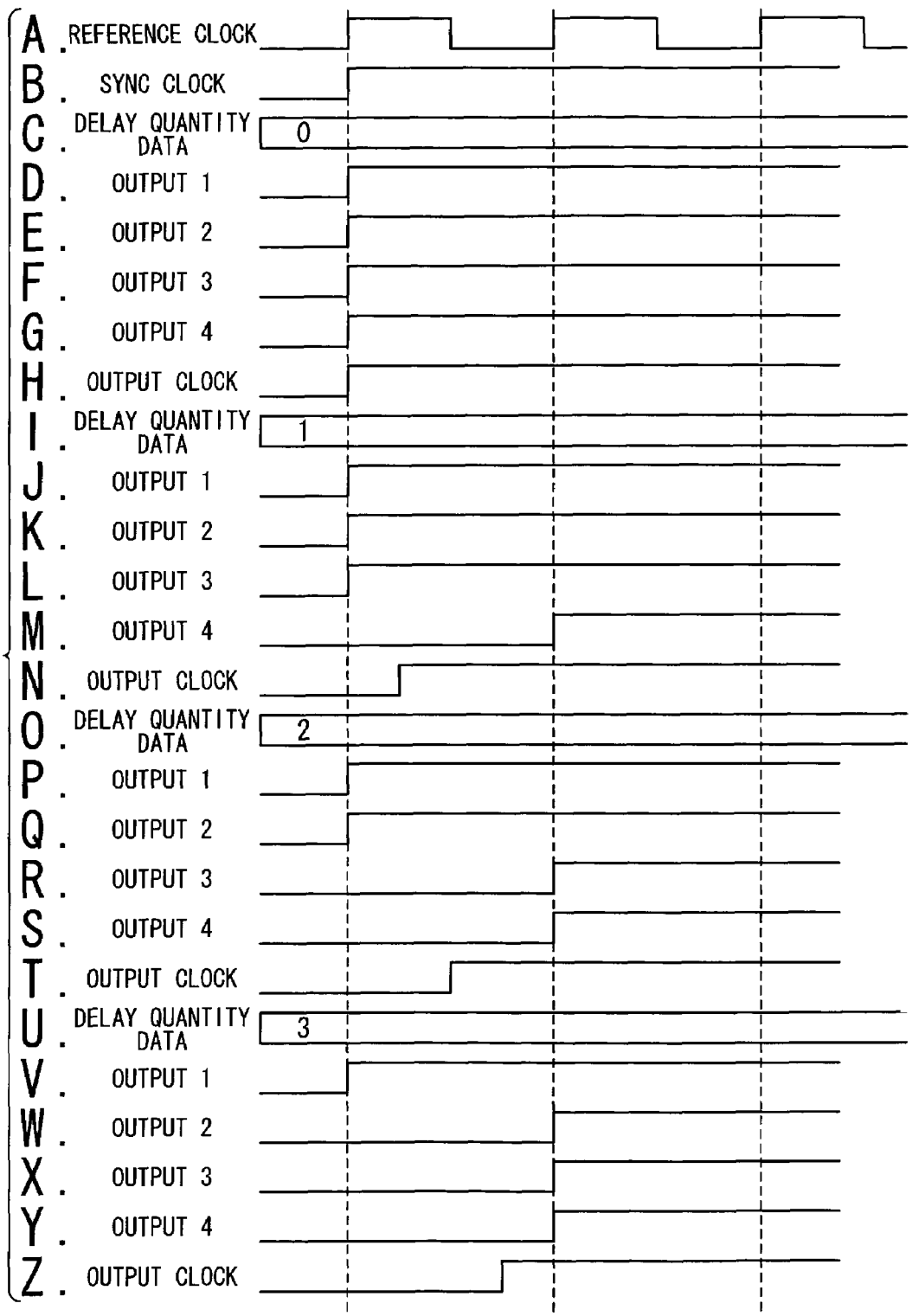
FIGS. 8A to 8Z are timing charts showing the phase control operation of the VCO circuit in the second embodiment.

The phase control operation of the VCO circuit in the second embodiment will be described with reference to FIGS. 8A to 8Z. When the delay quantity calculating section 1122 in the VCO 21 outputs "0" as the delay quantity data, the multi-phase signal generating circuit 22 outputs the clock signals onto all of the four output signal lines at the timing with no delay from the output timing of the reference clock signal period. In this case, signals corresponding to the clock signals with no delay are added by the adder 233. Therefore, the output clock signal of the averaged phase output circuit 23 obtained by averaging the fourth clock signals is also outputted at the timing with no delay from the output timing of the reference clock signal period. Also, when the delay quantity calculating section 1122 outputs "1" as the delay quantity data, the multi-phase signal generating circuit 22 outputs the three clock signals onto three of the four output signal lines at the timing with no delay from the output timing of the reference clock signal period and outputs the clock signal onto the remaining signal line at the timing with a delay for one period of the reference clock signal. In this case, signals corresponding to the above four clock signals are added by the adder 233. Therefore, the output clock signal of the averaged phase output circuit 23 obtained by averaging the four clock signals is outputted to have a delay of 1/(3+1)=¼ period from the output timing of the reference clock signal period. Similarly, when delay quantity calculating section 1122 outputs "2" as the delay quantity data, the multi-phase signal generating circuit 22 outputs the two clock signals onto two of the four output signal lines at the timing with no delay from the output timing of the reference clock signal period and outputs the two clock signals on the remaining two signal lines at the timing with a delay for one period of the reference clock signal. In this case, signals corresponding to the two clock signals with no delay and the two clock signals with the delay are added by the adder 233. Therefore, the output clock signal of the averaged phase output circuit 23 obtained by averaging these clock signals is outputted at the timing with a delay of 2/(2+2)=½ period from the output timing of the reference clock signal period. Similarly, when delay quantity calculating section 1122 outputs "3" as the delay quantity data, the multi-phase signal generating circuit 22 outputs the one clock signal onto one of the four output signal lines at the timing with no delay from the output timing of the conventional sync clock signal and outputs the three clock signals on the remaining three signal lines at the timing with a delay for one period of the reference clock signal from the output timing of the reference clock signal period. In this case, signals corresponding to the one clock signal with no delay and the three clock signals with the delay are added by the adder 233. Therefore, the output clock signal of the averaged phase output circuit 23 obtained by averaging these clock signals is outputted at the timing with a delay of 3/(3+1)=¾ period from the output timing of the reference clock signal period.

Figure 9:
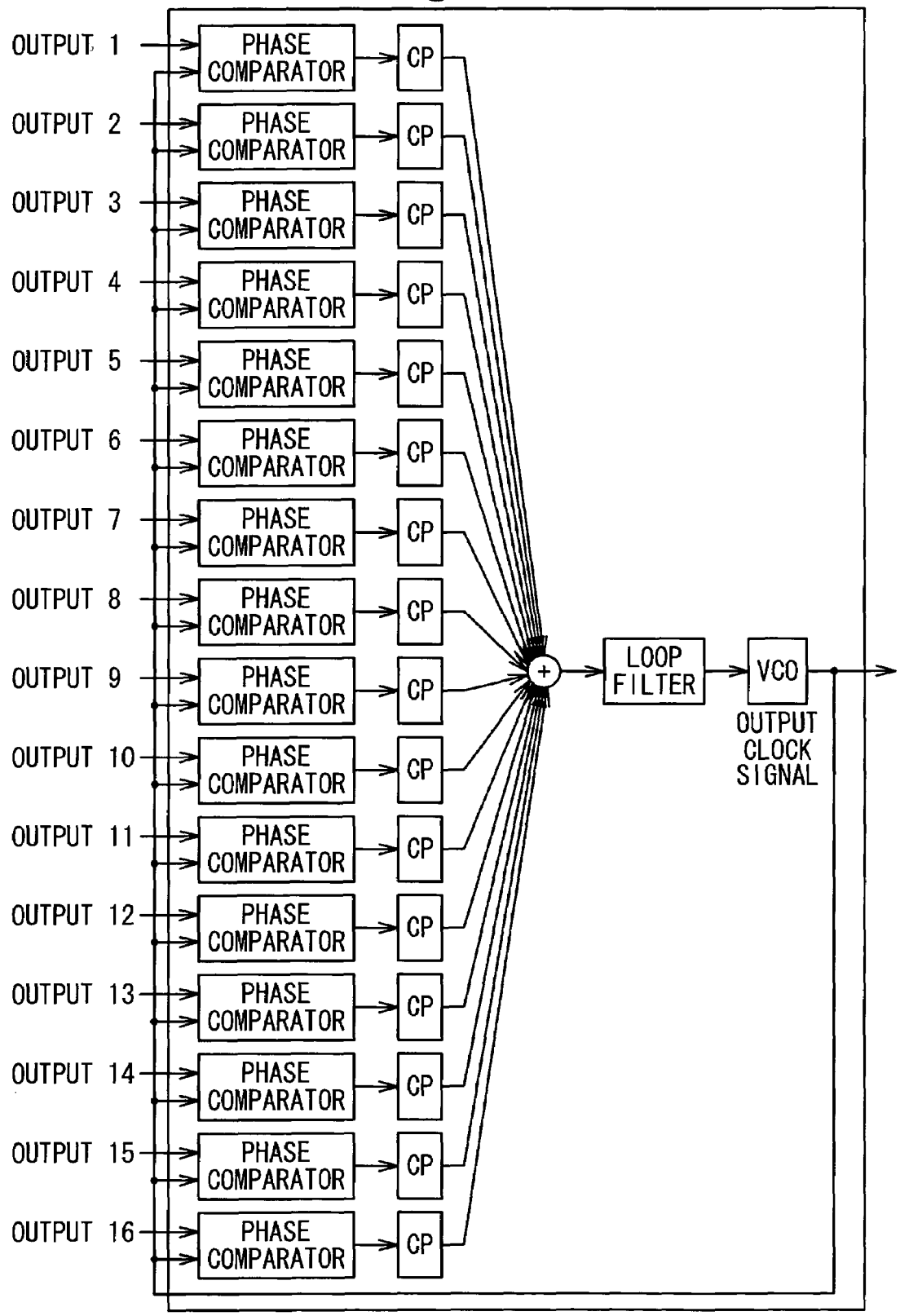
FIG. 9 is a diagram showing the circuit configuration of the average phase output circuit of the VCO circuit in the second embodiment when the output of a multiphase signal generating circuit takes one of 16 values.
Figure 10:
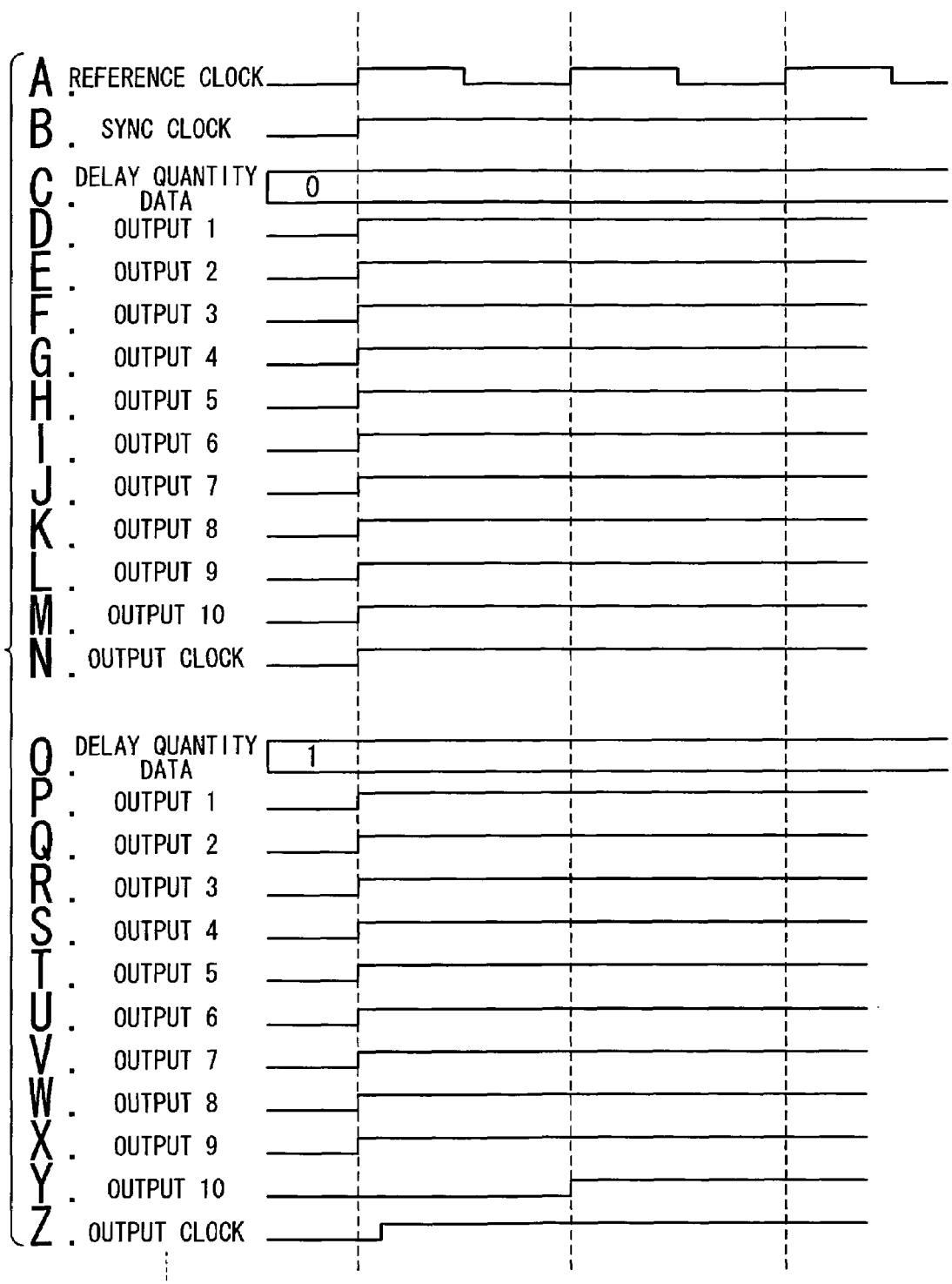
FIGS. 10A to 10Z and 11A to 11AL are timing charts showing the phase control operation of the VCO circuit in the second embodiment when the average phase output circuit has the circuit configuration shown in FIG. 9.
Figure 11:
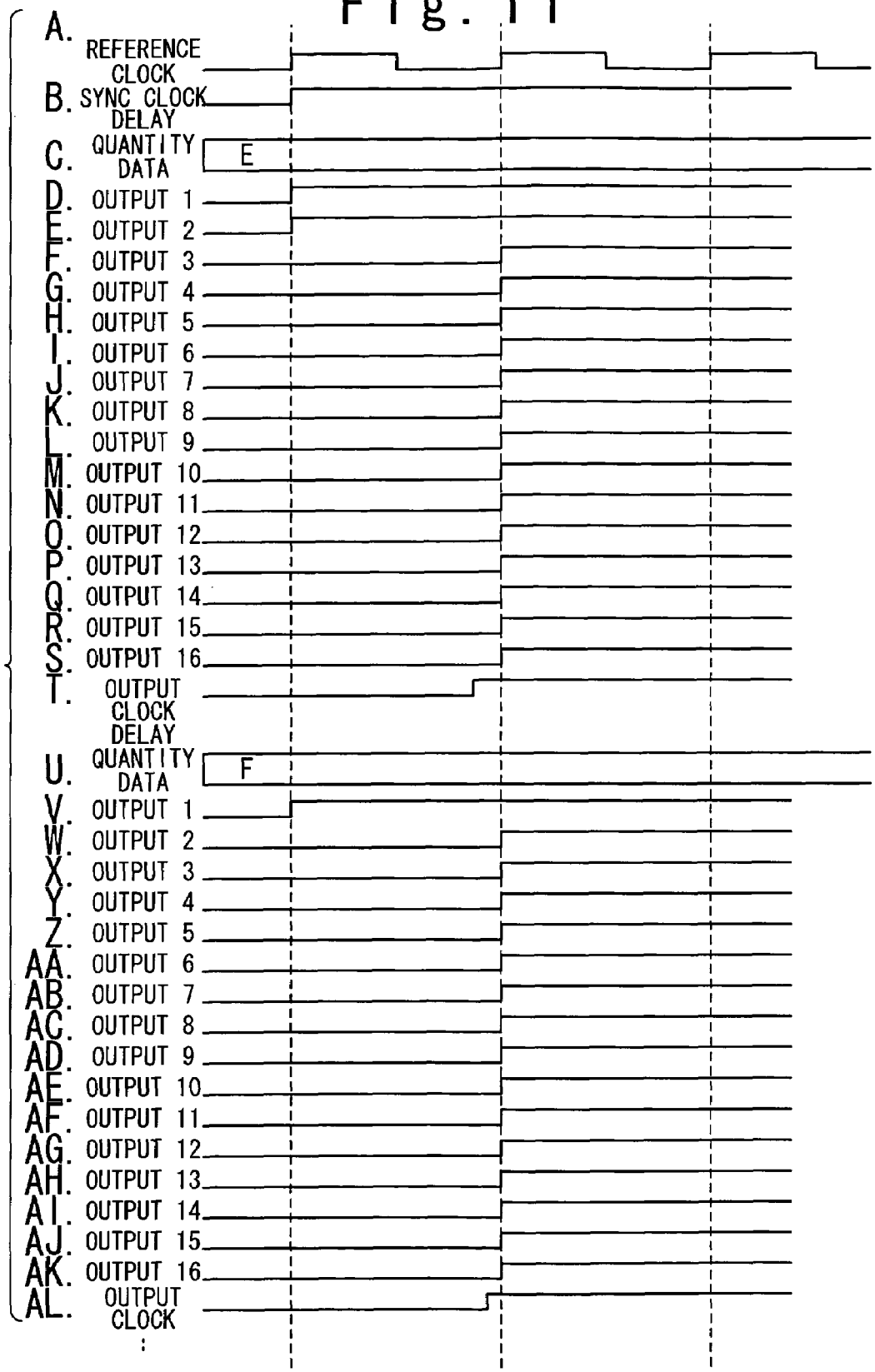

FIG. 9 is a diagram showing the circuit configuration of the averaged phase output circuit 23 when the delay quantity data is 4 bits (16 values). Also, FIGS. 10A to 10AL and 11A to 11AL are diagrams showing the timing of the input/output signals when the averaged phase output circuit 23 has the circuit configuration shows in FIG. 9. Like the averaged phase output circuit with the circuit configuration shown in FIG. 8, the output phase of the output clock signal is determined based on a ratio of the number of clock signals with delays of the plurality of multi-phase clock signals and the number of clock signals with no delay thereof.

In this way, the VCO circuit according to the second embodiment can determine the output timing of the output clock signal in the resolution higher than one period of the reference clock signal.

Third Embodiment

The VCO circuit according to the third embodiment of the present invention will be described. The VCO circuit in the third embodiment includes the VCO 21, the multi-phase signal generating circuit 22 and an averaged phase output circuit 33, like the second embodiment. The VCO 21 and the multi-phase signal generating circuit 22 are same as those of the second embodiment.

Figure 12:
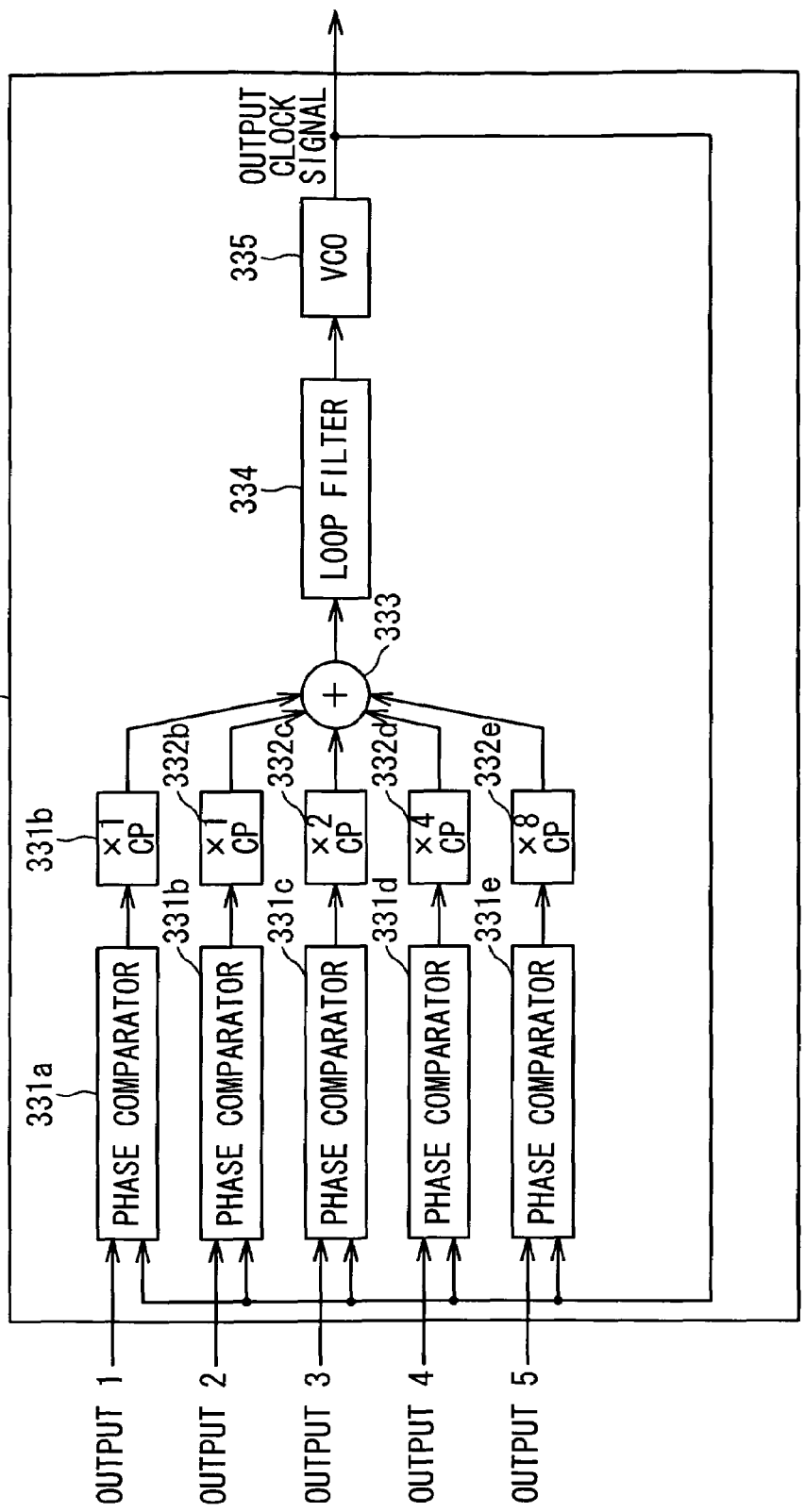
FIG. 12 is a block diagram showing the circuit configuration of the average phase output circuit of the VCO circuit in a third embodiment.

FIG. 12 is a block diagram showing the circuit configuration of the averaged phase output circuit 33 which is applied to the VCO circuit in the third embodiment. The averaged phase output circuit 33 includes phase comparators 331a to 331e, charge pumps 332a to 332e, an adder 333, a loop filter 334 and a VCO 335. The phase comparators 331a to 331e, the adder 353, the loop filter 334 and the VCO 335 are same as those of the second embodiment.

The charge pumps 332a to 332e have different conversion efficiencies, and outputs different voltages when signals with a same amplitude are supplied, respectively. Specifically, it is supposed that when a signal with an amplitude is supplied to the charge pump 332a, the amplitude of a signal outputted from the charge pump 332a is "1". When the same signal is supplied to the charge pump 332b, a signal with the amplitude of "1" is outputted from the charge pump 332b. When the same signal is supplied to the charge pump 332c, a signal with the amplitude of "2" is outputted from the charge pump 332c. When the same signal is supplied to the charge pump 332d, a signal with the amplitude of "4" is outputted from the charge pump 332d. When the same signal is supplied to the charge pump 332e, a signal with the amplitude of "8" is outputted from the charge pump 332e. That is, the charge pumps 332a to 332e apply the weights of "1", "1", "2", "4" and "8" to the supplied signals, respectively. Therefore, considering that the charge pump 332b outputs a value of the lowest digit or the digit of "1", the charge pump 332c outputs a value of the next lowest digit or the digit of "10", the charge pump 332b outputs a value of the next lowest digit or the digit of "100", and the charge pump 332c outputs a value of the next lowest digit or the digit of "1000". Data of these four digits represents binary data of 4 bits. That is, by combining the output values of the charge pumps 332b to 332e, values of 16 kinds can be expressed.

Figure 13:
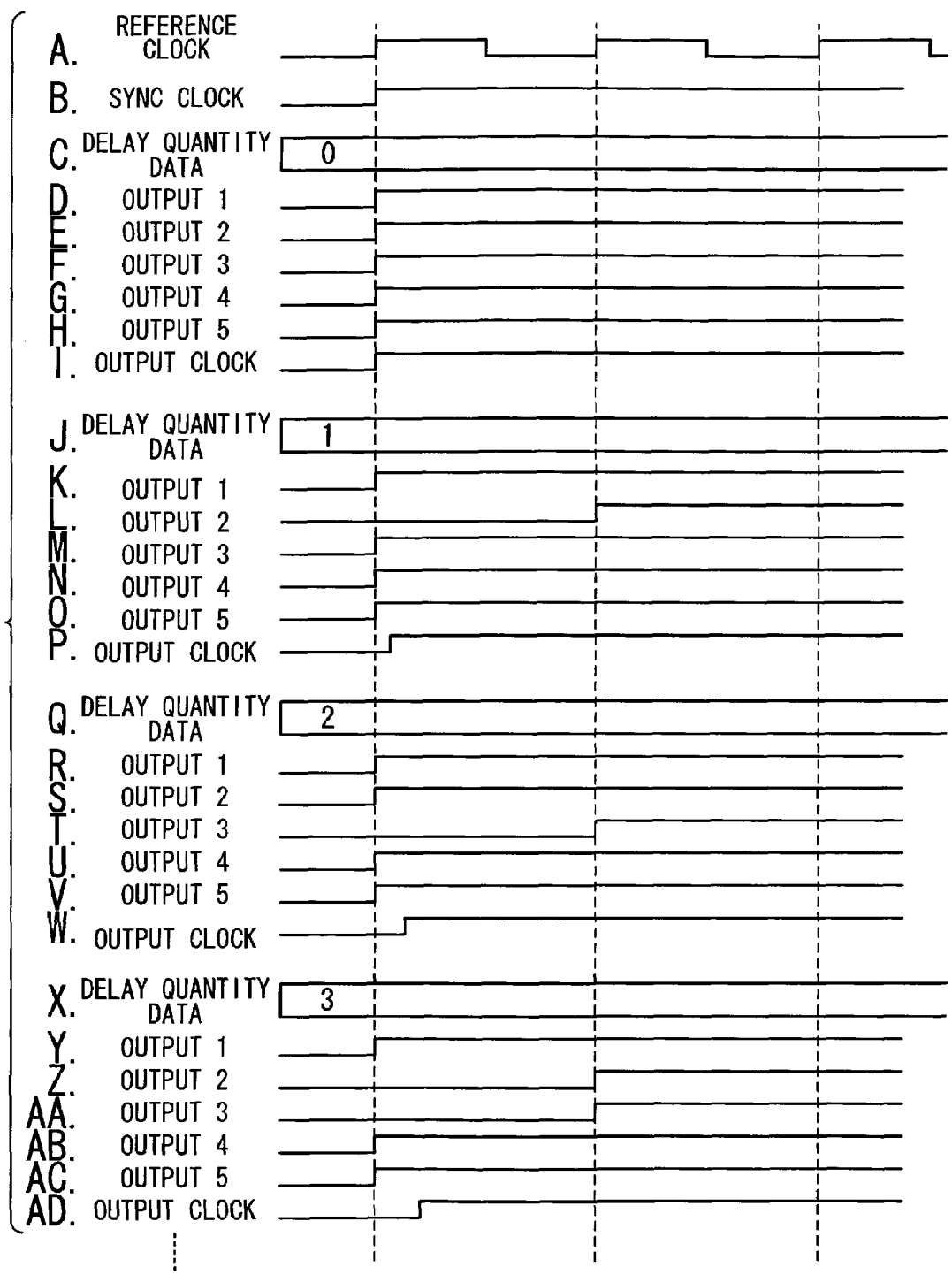
FIGS. 13A to 13AD and 14A to 14W are timing charts showing the phase control operation of the VCO circuit in the third embodiment when the average phase output circuit has the circuit configuration shown in FIG. 12.
Figure 14:
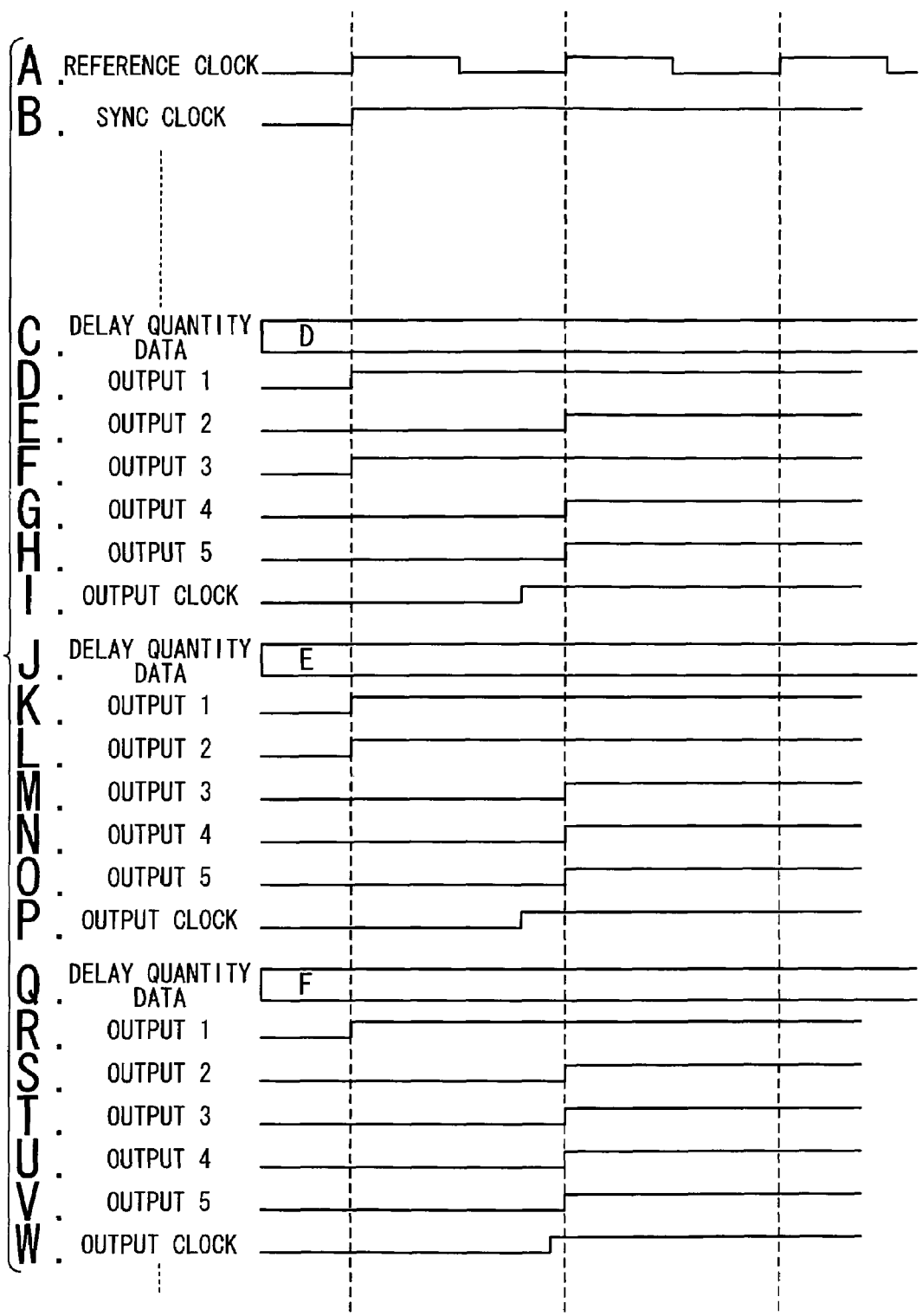

The phase control of the VCO circuit in the third embodiment will be described that with reference to FIGS. 13A to 13AD and 14A to 14W. When the delay quantity calculating section 1122 in the VCO 21 outputs "0" as the delay quantity data, the multi-phase signal generating circuit 22 outputs the clock signals onto all of the five output signal lines at the timing with no delay from the output timing of the reference clock signal. In this case, signals corresponding to the clock signals with no delay are added by the adder 333. Therefore, the output signal of the averaged phase output circuit 33 is outputted at the timing with no delay from the output timing of the reference clock signal.

When the delay quantity calculating section 1122 outputs "1" as the delay quantity data, the multi-phase signal generating circuit 22 outputs the clock signals with no delay from the output timing of the reference clock signal to the phase comparators 331a and 331c to 331e and the clock signal with a delay for one period of the reference clock signal to the phase comparator 331b. In this case, the adder 333 adds signals corresponding to the four clock signals with no delay, which have the weights of 1, 2, 4 and 8, and the clock signal with the delay for one period of the reference clock signal. Therefore, the output signal of the averaged phase output circuit 33 has a delay of 1/16 (=1/(1+1+2+4+8)) period from the output timing of the reference clock signal.

Also, when the delay quantity calculating section 1122 outputs "2" as the delay quantity data, the multi-phase signal generating circuit 22 outputs the clock signals with no delay from the output timing of the reference clock signal to the phase comparators 331a, 331b, 331d and 331e and one clock signal with the delay for one period of the reference clock signal to the phase comparator 331c. In this case, the adder 333 adds signals corresponding to the four clock signals with no delay, which have the weights of 1, 1, 4 and 8, and the clock signal with the delay for one period of the reference clock signal. Therefore, the output signal of the averaged phase output circuit 33 has a delay of 1/8 (=2/16) period from the output timing of the reference clock signal.

Similarly, when the delay quantity calculating section 1122 outputs "3" as the delay quantity data, the multi-phase signal generating circuit 22 outputs the clock signals with no delay from the output timing of the reference clock signal to the phase comparators 331a, 331d and 331e and two clock signals with the delay for one period of the reference clock signal to the phase comparator 331b and 331c. In this case, the adder 333 adds signals corresponding to the four clock signals with no delay, which have the weights of 1, 4 and 8, and the clock signal with the delay for one period of the reference clock signal. Therefore, the output signal of the averaged phase output circuit 33 has a delay by 3/16 of the period from the output timing of the reference clock signal.

In this way, in the third embodiment, the delay quantity data is expressed 4-bit binary data which has the output of the charge pump 332b as a digit value of "1", the output of the charge pump 332c as a digit value of "10", the output of the charge pump 332d as a digit value of "100", and the output of the charge pump 332e as a digit value of "1000". Thus, the same resolution as in the above example can be achieved by the phase comparators less than in the circuit configuration in which the weighting is not carried out. That is, with the simpler circuit configuration, the phase precision can be improved.

It should be noted that in the third embodiment, the weighting of the charge pumps are carried out to indicate a binary value. However, it is possible to carry out the weighting to an optional value.

Fourth Embodiment

Figure 15:
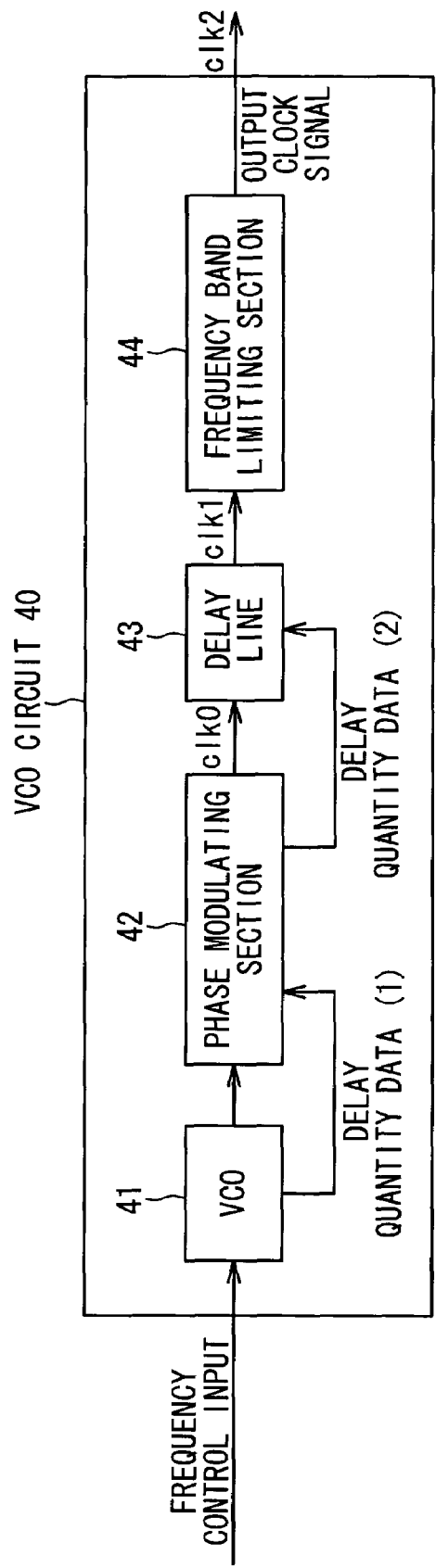
FIG. 15 is a block diagram showing the circuit configuration of the VCO circuit according to a fourth embodiment of the present invention.

The VCO circuit according to the fourth embodiment of the present invention will be described. FIG. 15 shows the circuit configuration of the VCO circuit in the fourth embodiment. The VCO circuit 40 has a VCO 41, a phase modulating section 42, a delay line 43 and a frequency band limiting section 44. The VCO 41 and the delay line 43 are same as those of the VCO circuit 10 according to the first embodiment. The phase modulating section 42 phase-modulates the clock signal supplied from the VCO 41 based on delay quantity data (1) supplied from the VCO 41 and outputs the phase-modulated clock signal as a clock signal clk0 and delay quantity data (2) to the delay line 43. It should be noted that the delay quantity data in this embodiment is equivalent to "the delay quantity data" of each of the above embodiments. The frequency band limiting section 44 carries out band limitation to the clock signal clk1 supplied from the delay line 43, passes only a predetermined frequency component of the clock signal clk1 and outputs it as the output clock signal (a clock signal clk2).

Figure 16:
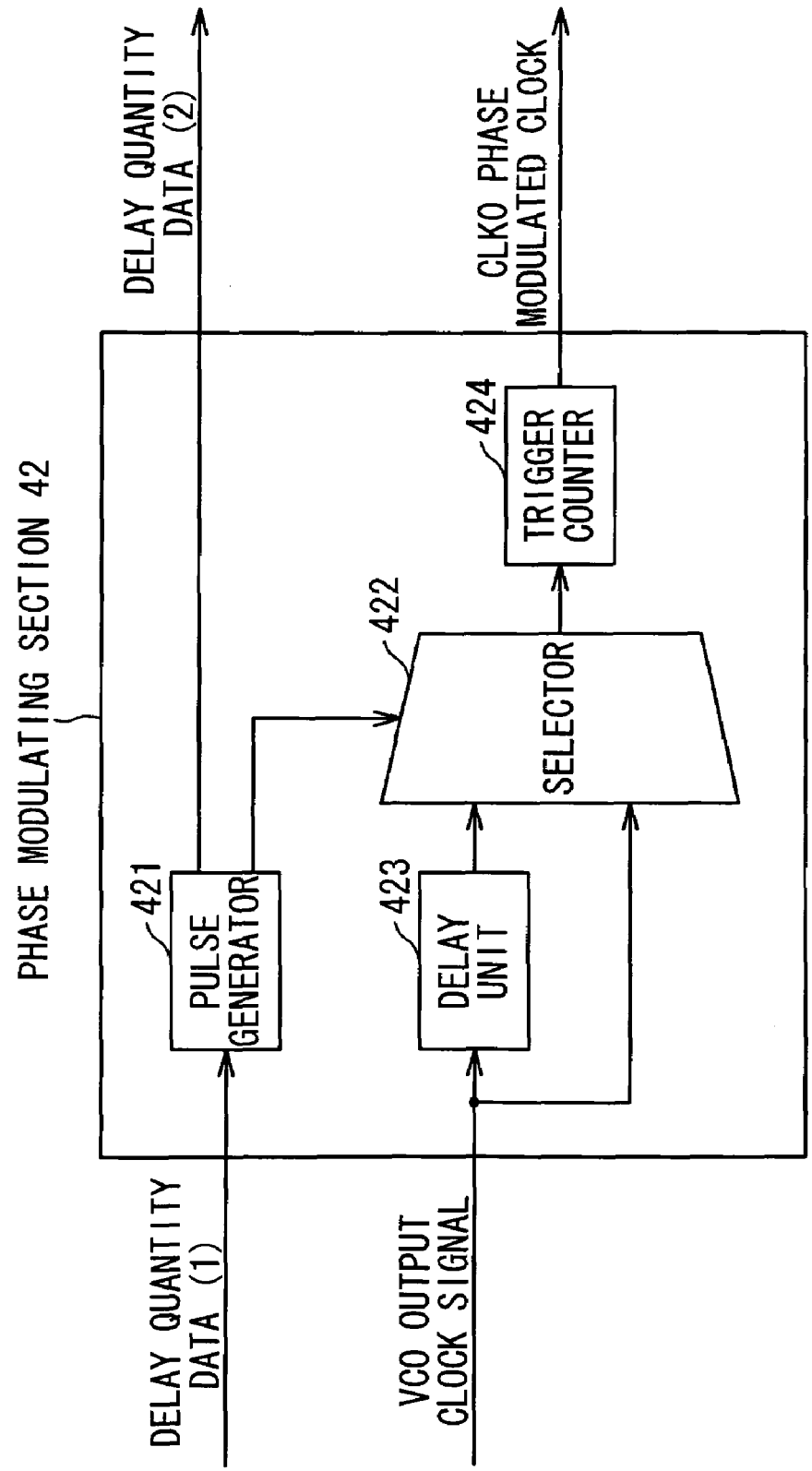
FIG. 16 is a block diagram showing the circuit configuration of a phase modulating section of the VCO circuit in the fourth embodiment.

FIG. 16 shows the circuit configuration of the phase modulating section 42. The phase modulating section 42 includes a pulse generator 421, a selector 422, a delay unit 423 and a trigger counter 424. The pulse generator 421 generates a phase control pulse and the delay quantity data (2) based on the delay quantity data (1) supplied from the VCO 41. The pulse generator 421 outputs the phase control pulse to the selector 422, and outputs the delay quantity data (2) to the delay line 43. The delay quantity data (2) is generated based on a duty ratio of the phase control pulse and the phase resolution desired in the delay line 43. The delay unit 423 delays the VCO output clock signal by the period of the reference clock signal and then outputs it to the selector 422. The selector 422 selects the VCO output clock signal and the delayed VCO output clock signal in response to the phase control pulse. Thus, the selector 422 carries out phase shift to the VCO output clock signal based on the phase control pulse supplied from the pulse generator 421 to change the period. The trigger counter 424 converts the signal selected by the selector 422 into a clock signal with the duty ratio of 50% and then outputs it as a phase modulated clock signal clk0.

By adopting the above circuit configuration, the phase modulating section 42 carries out the phase modulation of $2\pi*F/Fref$ to the input VCO output clock signal, and outputs as the phase modulated clock signal clk0.

The operation of the VCO circuit 40 in the fourth embodiment will be described. The output period resolution of the VCO 41 is influenced by the frequency Fref of the reference clock signal supplied to the VCO 41. When a desired oscillation frequency F is coincident with Fref/N (N is an integer), the VCO 41 can output the VCO output clock signal with the desired frequency correctly. However, when the desired oscillation frequency F is between Fref/N and Fref/(N+1), a signal with the desired frequency F cannot be correctly outputted. In such a case, the clock signal with the period of N/Fref (=frequency Fref/N) and the clock signal with the period of (N+1)/Fref (=frequency Fref/(N+1)) are alternately outputted in a predetermined rate.

It is supposed that a clock signal with the desired frequency between the frequency Fref/N and the frequency Fref/(N+1) is outputted from the VCO 41. Hereinafter, this frequency range is referred to especially as "f" of the output frequency F of the VCO 41). In this case, a phase error φ is caused between an ideal phase for the oscillation frequency f (ideal phase) and the phase an actual output clock signal. The maximum value φm of this phase error φ, in other words, the maximum value φm of the phase error generated in a frequency range equal to or lower than the frequency of the reference clock signal (Fref) for the VCO 41 can be expressed by the following equation (1).

$$\phi m = 2\pi * f/Fref \quad (1)$$

It is desirable that the maximum value φm is small.

In case that the signal with the above frequency f is outputted from the VCO 41, when α (0<α<1) is a rate of the clock signal with the period of N/Fref and (1−α) is a rate of the clock signal with the period of (N+1)/Fref, the output frequency f is expressed by the following equation (2):

$$f = Fref/(N+\alpha) \quad (2)$$

The output of the VCO 41 is a phase-modulated spectrum, observing on the frequency axis. The interval Δf between the fundamental frequency of the output signal with the frequency f and the sideband (spurious band) generated in the neighborhood of the fundamental frequency is expressed by the following equation (3):

$$\Delta f = f*\alpha = Fref*\alpha/(N+\alpha) \quad (3)$$

Therefore, it would be understood from the equation (3) that when the oscillation with the frequency f should be generated under the condition that the reference clock signal frequency Fref is not so high compared with the oscillation frequency f, the interval Δf becomes smaller and the sideband frequencies approach the fundamental frequency f.

In this case, even if an analog PLL is connected with the next stage to the VCO circuit 40 and the frequencies are averaged, the sideband component (spurious band component) cannot be removed due to the influence of the small sideband component of the smaller interval Δf in the neighborhood of the fundamental frequency, and jitter increases on the output clock signal.

In the VCO circuit 40 in the fourth embodiment, the phase modulating section 42 carries out the phase modulation to the output from the digital VCO 41, by using the delay quantity data (1) outputted from the digital VCO 41. As the result of the phase modulation, it is possible to change only the frequency characteristics of the sideband without changing the fundamental frequency. Especially, it is possible to shift a spectral component (spurious band component) in the neighborhood fundamental frequency into a band apart from the fundamental frequency t (Δf becomes larger than that before the phase modulation).

The output clock signal clk0 after the phase modulation is outputted onto the delay line 43 and is delayed so as to generate a clock signal clk1, which is passed through a frequency band limiting section 44 (BPF or PLL). As a result, the spurious band component which has been shifted is removed. The removal of the spurious band component can be carried out easily by the frequency band limiting section 3, because the interval Δf becomes larger through the phase modulation.

When the oscillation frequency F is f(=Fref/(N+α)), and α is a value shifted a little from 0, the above-mentioned saw teeth like phase error φ with a low frequency is outputted from the VCO 41. In this case, correction for one period (Tm) of a master clock signal is carried out at the edge timing of the saw teeth of the phase error φ.

In order to carry out the phase modulation to the input clock signal, for example, the pulse generator 421 changes a frequency of the generation of the phase control pulse in the following cases in the regions which are obtained by dividing the period to be corrected totally for the output clock signal by w equally. The phase control pulse is supplied to the selector 422, and the phase is shifted when the signal passes through the selector 422.

When the resolution of the delay line 43 is Tm/4 (in other words, the reference clock signal period is equally divided into four so as to generate the delay quantity data (1)) and the resolution should be increased to 4 times through the phase modulation, the pulse generator 421 generates and outputs the phase control pulse to the selector 422 and the delay quantity data (2) to the delay line 43 in accordance with the following 16 cases.

(1) When the phase error is equal to or larger than 0 and less than Tm/16, "1" is outputted as the delay quantity data (2) at the rate of once for every four cycles of the output clock signal, and otherwise, "0" is outputted as the delay quantity data (2). "0" is always outputted as the phase control pulse (a selector control signal).

(2) When the phase error is equal to or larger than Tm/16 and less than Tm/8, "1" is outputted as the delay quantity data (2) at the rate of twice for every four cycles of the output clock signal, and otherwise, "0" is outputted as the delay quantity data (2). "0" is always outputted as the phase control pulse.

(3) When the phase error is equal to or larger than Tm/8 and less than 3Tm/16, "0" is outputted as the delay quantity data (2) at the rate of three times for every four cycles of the output clock signal, and otherwise, "0" is outputted as the delay quantity data (2). "0" is always outputted as the phase control pulse.

(4) When the phase error is equal to or larger than 3Tm/16 and less than Tm/4, "1" is outputted as the delay quantity data (2) at the rate of four times for every four cycles of the output clock signal (that is, at all the timings). "0" is always outputted as the phase control pulse.

(5) When the phase error is equal to or larger than Tm/4 and less than 5Tm/16, "2" is outputted as the delay quantity data (2) at the rate of once for every four cycles of the output clock signal, and otherwise, "1" is outputted as the delay quantity data (2). "0" is always outputted as the phase control pulse.

(6) When the phase error is equal to or larger than 5Tm/16 and less than 3Tm/8, "2" is outputted as the delay quantity data (2) at the rate of twice for every four cycles of the output clock signal, and otherwise, "1" is outputted as the delay quantity data (2). "0" is always outputted as the phase control pulse.

(7) When the phase error is equal to or larger than 3Tm/8 and less than 7Tm/16, "2" is outputted as the delay quantity data (2) at the rate of three times for every four cycles of the output clock signal, and otherwise, "1" is outputted as the delay quantity data (2). "0" is always outputted as the phase control pulse.

(8) When the phase error is equal to or larger than 7Tm/16 and less than Tm/2, "2" is outputted as the delay quantity data (2) at the rate of four times for every four cycles of the output clock signal (that is, at all the timings). "0" is always outputted as the phase control pulse.

(9) When the phase error is equal to or larger than Tm/2 and less than 9Tm/16, "3" is outputted as the delay quantity data (2) at the rate of once for every four cycles of the output clock signal, and otherwise, "2" is outputted as the delay quantity data (2). "0" is always outputted as the phase control pulse.

(10) When the phase error is equal to or larger than 9Tm/2 and less than 9Tm/16, "3" is outputted as the delay quantity data (2) at the rate of twice for every four cycles of the output clock signal, and otherwise, "2" is outputted as the delay quantity data (2). "0" is always outputted as the phase control pulse.

(11) When the phase error is equal to or larger than 5Tm/8 and less than 11Tm/16, "3" is outputted as the delay quantity data (2) at the rate of three times for every four cycles of the output clock signal, and otherwise, "2" is outputted as the delay quantity data (2). "0" is always outputted as the phase control pulse.

(12) When the phase error is equal to or larger than 11Tm/16 and less than 3Tm/4, "3" is outputted as the delay quantity data (2) at the rate of four times for every four cycles of the output clock signal (that is, at all the timings). "0" is always outputted as the phase control pulse.

(13) When the phase error is equal to or larger than 3Tm/4 and less than 13Tm/16, "1" as the phase control pulse and "0" as the delay quantity data (2) are outputted at the rate of once for every four cycles of the output clock signal, and otherwise, "0" is outputted as the phase control pulse, and "3" is outputted as the delay quantity data (2).

(14) When the phase error is equal to or larger than 13Tm/16 and less than 7Tm/8, "1" as the phase control pulse and "0" as the delay quantity data (2) are outputted at the rate of twice for every four cycles of the output clock signal, and otherwise, "0" is outputted as the phase control pulse, and "3" is outputted as the delay quantity data (2).

(15) When the phase error is equal to or larger than 7Tm/8 and less than 15Tm/16, "1" as the phase control pulse and "0" as the delay quantity data (2) are outputted at the rate of three times for every four cycles of the output clock signal, and otherwise, "0" is outputted as the phase control pulse, and "3" is outputted as the delay quantity data (2).

(16) When the phase error is equal to or larger than 15Tm/16 and less than Tm, "1" as the phase control pulse and "0" as the delay quantity data (2) are outputted at the rate of once for every four cycles of the output clock signal, and otherwise, "0" is outputted as the phase control pulse, and "3" is outputted as the delay quantity data (2).

When the phase control pulse is generated by the pulse generator 421 as described above and the phase shift is carried out to the input clock signal by the selector 422 based on the phase control pulse, the phase error of the output clock signal clk0 after the phase modulation has the waveform similar to that of a signal to which a pulse width modulation is carried out. This is because the phase error has such a waveform that the modulation is carried out at the frequency higher than before the phase modulation.

The delay line 43 delays the clock signal clk0 outputted from the phase modulating section 42 based on delay quantity data (2) like the above embodiments and outputs the delayed signal as a clock signal clk1.

By limiting the band of the signals clk1 by the frequency band limiting section 44, the phase error $\phi$ is compressed to about 1/w (about 1/16 in the above example), compared with the phase error before the phase modulation. Thus, the output with small jitter can be obtained.

A specific example of the operation of the VCO circuit 40 will be described. When a signal with the phase delayed by 3Tm/8 from the reference clock signal with the period Tm should be outputted, the phase modulating section 42 continues to output the clock signal with no delay due to the phase modulation. Also, the phase modulating section 42 outputs the delay quantity data (2) corresponding to Tm/4 and the delay quantity data (2) corresponding to 2Tm/4 at the ratio of 1:1. Thus, the clock signal delayed by 3Tm/8=((2Tm/4)+(Tm/4))/2 is outputted as the clock signal clk2 from the delay line 43.

Also, the clock signal clk2 with the phase delayed by 3Tm/8 from the reference clock signal can be outputted by outputting a combination of the clock with no delay due to the phase modulation and the delay quantity data (2) corresponding to 3Tm/4 and a combination of a clock signal with the delay of Tm due to the phase modulation and the delay quantity data corresponding to 0 at the ratio of 1:1.

The VCO circuit 40 in the fourth embodiment can adjust the output timing of the clock signal not only by delaying the clock signal by the delay line 43 but also by carrying out the phase modulation by the phase modulating section 42 and by applying a frequency band limitation to this. Therefore, the phase resolution can be made further higher by combining the delay quantity based on the phase modulation by the phase modulating section 42 and the delay quantity by the delay line 43.

It should be noted that a case where the VCO 41 has the same circuit configuration as the VCO 11 of the VCO circuit 10 in the first embodiment is described. However, the effect of the jitter reduction is conspicuously accomplished in the same way as the above even if the VCO 41 is used which is similar to the VCO circuit according to the second embodiment or the third embodiment.

Fifth Embodiment

Figure 17:
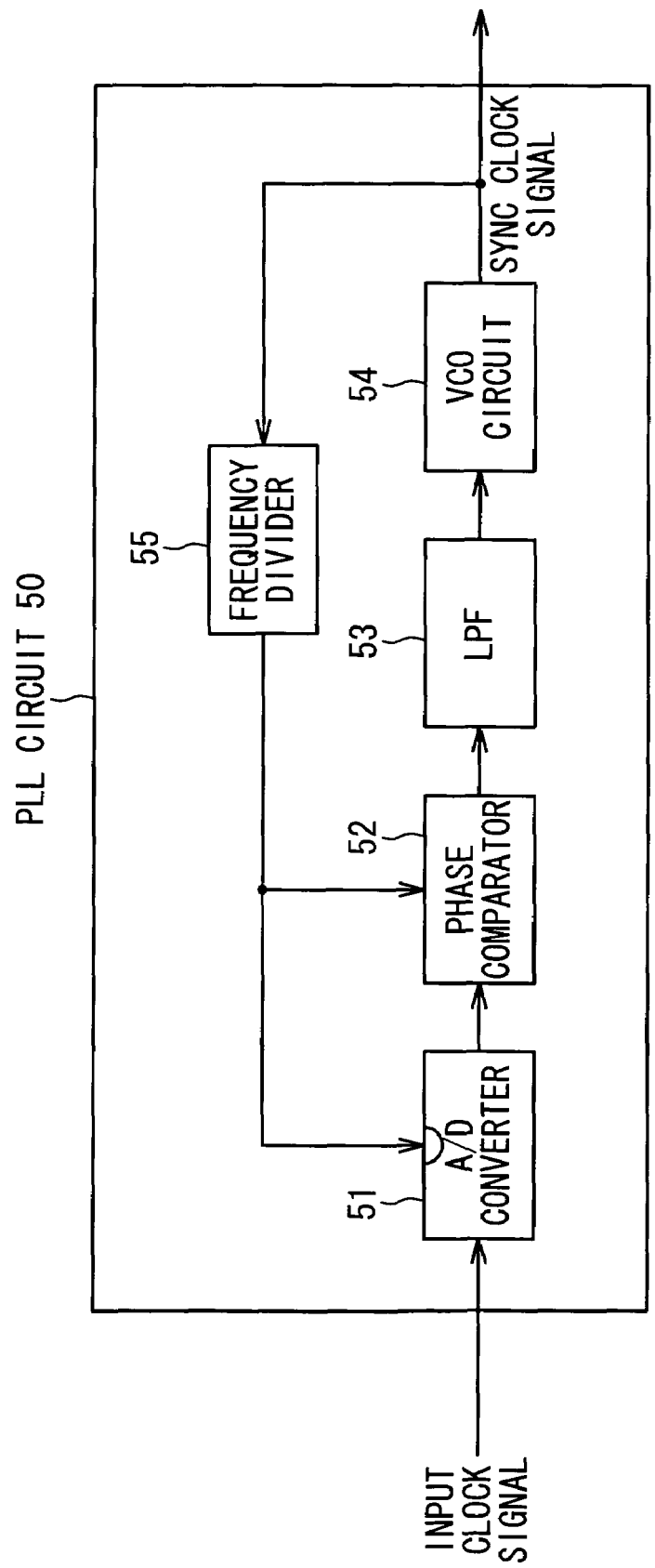
FIG. 17 is a block diagram showing the circuit configuration of a PLL circuit according to a fifth embodiment of the present invention.

A PLL circuit according to the fifth embodiment of the present invention will be described. FIG. 17 shows the circuit configuration of the PLL circuit in the fifth embodiment. The PLL circuit 50 includes an analog-to-digital converter 51, a phase comparator 52, a LPF 53, a VCO circuit 54 and a frequency divider 55.

The analog-to-digital converter 51 operates by using a signal supplied from the frequency divider 55 as a sampling clock signal and converts an inputted analog signal supplied from a circuit (not shown) in a front stage into a digital signal. The phase comparator 52 outputs digital phase difference data (which is different from the phase error $\phi$ described above) between the input signal to the PLL circuit 50 and the signal supplied from the frequency divider 55 based on the digital signal from the analog-to-digital converter 51. The LPF 53 averages the phase difference data supplied from phase comparator 52 and outputs the result to the VCO circuit 54 as phase control data. The VCO circuit 54 has the same circuit configuration as the VCO circuit 10 in the above first embodiment and outputs the output clock signal in accordance with the phase control data. The output clock signal is outputted from the VCO circuit 54 to a circuit (not shown) in a subsequent stage and the frequency divider 55. The frequency divider 55 divides the output clock signal supplied from the VCO circuit 54 into N and outputs it to the analog-to-digital converter 51. The PLL feedback loop of the above configuration is provided in the PLL circuit 50.

It should be noted that there is a case that the PLL circuit 50 does not have the analog-to-digital converter 51 therein. In this case, the input signal to the PLL circuit 50 is digital, and the phase comparator 52 carries out phase comparison between the digital input signal and the frequency divider output signal by counting a high-speed clock signal and outputs the phase difference data.

In the PLL circuit 50 in the fifth embodiment, the VCO circuit 54 has the phase resolution higher than that of the conventional VCO circuit. Therefore, the signal synchronized in a high precision with the input signal supplied externally can be outputted.

It should be noted that a case where the VCO circuit 54 has the same circuit configuration as the VCO circuit 10 in the first embodiment is described. However, like the above, the signal synchronized in high precision can be outputted from the PLL circuit even if the VCO circuit with the same circuit configuration as the VCO circuit according to the second, third or fourth embodiment.

Sixth Embodiment

Figure 18:
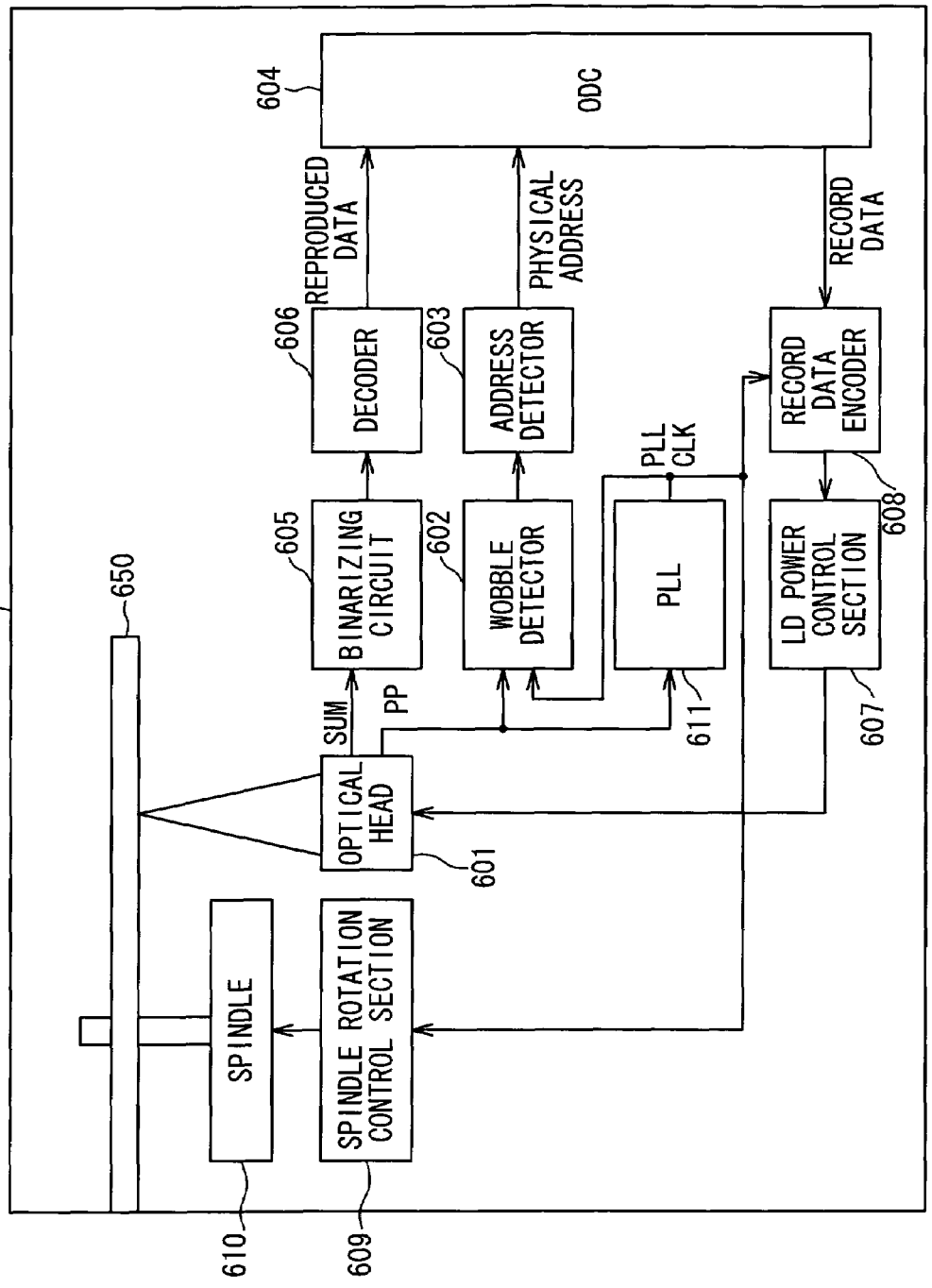
FIG. 18 is a block diagram showing the circuit configuration of a data recording apparatus according to a sixth embodiment of the present invention.

A data recording apparatus according to the sixth embodiment of the present invention will be described. FIG. 18 shows the circuit configuration of the data recording apparatus 600 in the sixth embodiment. The data recording apparatus 600 is an apparatus to record or reproduce data on or from an optical disk 650. The data recording apparatus 600 includes an optical head 601, a wobble detector 602, an address decoder 603, an ODC (optical disk controller) 604, a binarizing circuit 605, a decoder 606, an LD power control section 607, a recorded data encoder 608, a spindle rotation control section 609 and a spindle 610 in addition to the PLL circuit 611. The PLL 611 has the same circuit configuration as the PLL circuit 50 according to the above fifth embodiment.

Here, the data recording apparatus 600 in which the PLL circuit 611 is applied to a signal reproduction system will be described by using an optical disk data recording apparatus especially. The recording medium 650 where a signal (data) is recorded is an optical disk 650. The data recorded on the optical disk 650 is reproduced by the signal reproduction system of the optical head 601, and the PLL circuit 611. Also, a data recording process is carried out to the optical disk 650 by a predetermined signal recording system. The ODC (optical disk controller) 604 includes a DSP and so on and controls the signal reproducing and the recording processes.

A wobble signal is superimposed on a push-pull signal (PP) read out by the optical head 601 from the optical disk 650 which is wobbled at the frequency to which a tracking actuator (not shown) of the optical head 601 cannot track. The push-pull signal is supplied to the PLL circuit 611 and the wobble detector 602 after the process of band limitation and is carried out.

The PLL circuit 611 outputs a synchronous reproduction clock signal by using the wobble signal superimposed on the push-pull signal as a rotation sync signal. This synchronous reproduction clock signal is used for the data recording process as a record clock signal (PLL-CLK). The record clock signal is supplied to the spindle control circuit 609 and is used to control the rotation of the spindle 610. At the same time, the record clock signal is supplied to the record data encoder 608 and the LD power control unit 607 and used to control the position of the optical head 601 and the intensity of the light to be emitted.

It should be noted that sensor data from the spindle motor may be used as the rotation sync signal. Also, a sensor may be provided independently of the optical head 601 to make it possible to generate the rotation sync signal from the sensor.

Physical address data is superimposed on the wobble signal which is superimposed on the push-pull signal. The wobble detector 602 separates the physical address data from the supplied push-pull signal in response to the record clock signal. The physical address data separated by the wobble detector 602 is outputted to the address decoder 603. The address decoder 603 specifies a physical address based on the acquired physical address data and notifies the physical address to the ODC 604.

The ODC 604 generates data indicating record data and a record start timing based on the physical address notified from the address decoder 603, and controls the recording process based on the generated data. The ODC 604 outputs the generated record data to the record data encoder 608. The record data encoder 608 modulates the record data acquired from the ODC 604, and outputs a control signal generated based on the modulated record data to the LD power control unit 607 such that the output level of a laser beam emitted from the optical head 601 is controlled to record the data on the optical disk 650.

The data recorded on the optical disk 650 can be read out by the optical head 601 as change in a reflection beam quantity. Therefore, a sum signal can be used. The sum signal is supplied to the binarizing circuit 605 and the binary data generated by the binarizing circuit 605 is outputted to a host apparatus as reproduction data through the decoder 606 and ODC 604.

The data recording apparatus 600 according to this embodiment includes the PLL circuit 611 which can output the synchronous clock signal in the phase resolution higher than the conventional example. Therefore, the irradiation position of the laser beam and the strength of the laser beam for the data recording process can be controlled in a higher precision. In this way, it is possible to increase the data record density on the optical disk 650 as a recording medium. Also, with this, it is possible to shorten a time necessary for positioning control of the optical head 601. Therefore, the speed-up of the record and reproduction of the data is possible.

Also, according to the present invention, the generation of spurious bands as a cause of jitter can be suppressed.

It should be noted that each of the above embodiments is only an example of the present invention. The present invention is not limited to these embodiments and various modifications are contained in the scope of the present invention.

What is claimed is:

1. A digital voltage controlled oscillator (VCO), comprising:
   a phase data generator, configured to receive a frequency control input in synchronization with a reference clock signal, and to generate a phase data subject to change dependent on a value of said frequency control input;
   a synchronous clock signal generator, connected to said phase data generator, and configured to receive said phase data from said phase data generator and to generate a synchronous clock signal based on said phase data as a first output of the VCO;
a delay quantity data generator, connected to said phase data generator and said synchronous clock signal generator, and configured i) to receive said frequency control input, said phase data, and said synchronous clock signal, and ii) to generate a delay quantity data as a second output of the VCO for delaying said synchronous clock signal based on said frequency control input and said phase data; and
a register,
wherein said phase data generator comprises:
an adder configured to add, as an addition result, the value of said frequency control input with a previously updated phase data generated by said delay quantity data generator and stored by said register; and
a surplus calculator, connected to said adder, and configured to receive the addition result from the adder and to output, as said phase data, a remainder of a division of the addition result by a predetermined value.

2. The digital VCO according to claim 1, wherein said synchronous clock signal generating section comprises:
a comparator configured to generate a signal level of said synchronous clock signal based on said phase data.

3. The digital VCO according to claim 1 wherein said delay quantity data generator comprises:
a delay data calculator configured to calculate said delay quantity data by dividing a difference between a predetermined threshold and said phase data by the value of said frequency control input.

4. A VCO circuit, comprising:
a digital VCO comprised of,
a phase data generator configured to receive a frequency control input in synchronization with a reference clock signal, and to generate a phase data subject to change dependent on a value of said frequency control input,
a synchronous clock signal generator, connected to said phase data generator, and configured to receive said phase data from said phase data generator and to generate a first synchronous clock signal based on said phase data, and
a delay quantity data generator, connected to said phase data generator and said synchronous clock signal generator, and configured i) to receive said frequency control input, said phase data, and said synchronous clock signal, and ii) to generate a first delay quantity data for delaying said first synchronous clock signal based on said frequency control input and said phase data;
a phase modulator, connected to said digital VCO, and configured to receive said first synchronous clock signal and said first delay quantity data from said digital VCO and to output a second synchronous clock signal and a second delay quantity data based on said first delay quantity data; and
a delay line, connected to said phase modulator, and configured to receive said second synchronous clock signal and said second delay quantity data from said phase modulator, and to delay said second synchronous clock signal, based on said second delay quantity data, and output said delayed second synchronous clock signal as an output clock signal,
wherein said VCO further comprises a register, and
wherein said phase data generator comprises i) an adder configured to add, as an addition result, the value of said frequency control input with a previously updated phase data generated by said delay quantity data generator and stored by said register, and ii) a surplus calculator, connected to said adder and configured to receive the addition result from the adder and to output, as said phase data, a remainder of a division of the addition result by a predetermined value.

5. A VCO circuit, comprising:
a digital VCO, comprised of,
a phase data generator configured to receive a frequency control input in synchronization with a reference clock signal, and to generate a phase data subject to change dependent on a value of said frequency control input,
a synchronous clock signal generator, connected to said phase data generator, and configured to receive said phase data from said phase data generator, and to generate a synchronous clock signal based on said phase data, and
a delay quantity data generator, connected to said synchronous clock signal generator and said phase data generator, and configured to receive said frequency control input, said phase data, and said synchronous clock signal, and to generate a delay quantity data for delaying said synchronous clock signal based on said frequency control input and said phase data; and
a delay line, connected to said digital VCO, and configured to receive said synchronous clock signal and said delay quantity data from said digital VCO, and to delay said synchronous clock signal, based on said delay quantity data, and output said delayed synchronous clock signal as an output clock signal,
wherein said VCO further comprises a register, and
wherein said phase data generator comprises i) an adder configured to add, as an addition result, the value of said frequency control input with a previously updated phase data generated by said delay quantity data generator and stored by said register, and ii) a surplus calculator, connected to said adder, and configured to receive the addition result from the adder and to output, as said phase data, a remainder of a division of the addition result by a predetermined value.

* * * * *